United States Patent
Miya et al.

(10) Patent No.: US 6,931,237 B2
(45) Date of Patent: Aug. 16, 2005

(54) COMMUNICATION DEVICE

(75) Inventors: Shinji Miya, Atsugi (JP); Nobuo Saito, Yokohama (JP)

(73) Assignee: Asahi Kasei Microsystems Co., Ltd., Tokyo (JP)

( * ) Notice: Subject to any disclaimer, the term of this patent is extended or adjusted under 35 U.S.C. 154(b) by 462 days.

(21) Appl. No.: 10/275,398

(22) PCT Filed: Feb. 21, 2002

(86) PCT No.: PCT/JP02/01571

§ 371 (c)(1),
(2), (4) Date: Nov. 5, 2002

(87) PCT Pub. No.: WO02/067452

PCT Pub. Date: Aug. 29, 2002

(65) Prior Publication Data

US 2003/0125006 A1 Jul. 3, 2003

(30) Foreign Application Priority Data

Feb. 21, 2001 (JP) .......................... 2001-45049

(51) Int. Cl.$^7$ ............................ H04B 1/40; H04B 1/44; H04B 1/06
(52) U.S. Cl. .......................... 455/75; 455/76; 455/255; 455/318; 455/550.1
(58) Field of Search .............................. 455/75, 76, 78, 455/183, 255, 315, 317, 318, 550.1

(56) References Cited

U.S. PATENT DOCUMENTS

| | | | |
|---|---|---|---|
| 5,689,819 A | 11/1997 | Nishimura et al. | |
| 5,794,131 A | * 8/1998 | Cairns | 455/76 |
| 5,966,666 A | * 10/1999 | Yamaguchi et al. | 455/552.1 |
| 6,061,575 A | * 5/2000 | Lombardi | 455/552.1 |
| 6,154,640 A | * 11/2000 | Itoh et al. | 455/76 |
| 6,754,474 B1 | * 6/2004 | Savelli et al. | 455/113 |
| 6,826,388 B1 | * 11/2004 | Tanaka et al. | 455/77 |

FOREIGN PATENT DOCUMENTS

| | | | |
|---|---|---|---|
| EP | 0792052 A1 | * 2/1997 | .......... H04L/27/00 |
| EP | 0 792 052 A1 | 8/1997 | |
| JP | 7-283842 | 10/1975 | |
| JP | 05041673 | 2/1993 | |
| JP | 05075495 | 3/1993 | |
| JP | 05110469 | 4/1993 | |
| JP | 8-331005 | 12/1996 | |
| JP | 9-233143 | 9/1997 | |
| JP | 9-261106 | 10/1997 | |
| JP | 10-4437 | 1/1998 | |
| JP | 2000-78051 | 3/2000 | |

* cited by examiner

*Primary Examiner*—Simon Nguyen
(74) *Attorney, Agent, or Firm*—Finnegan, Henderson, Farabow, Garrett & Dunner, L.L.P.

(57) ABSTRACT

A communication apparatus is provided which employs two oscillators to generate a transmission signal and a reception signal, and prevents harmful spurious components from being produced. As shown in FIGS. 9A and 9B, the oscillation frequency fVCO2 of a VCO 2 is given by fVCO2=N×(2×fDD), where fDD is the difference between the transmit frequency fT and receive frequency fR. A 3/(2×N) frequency multiplier outputs a signal with a frequency 3×fDD, and a divide-by-N circuit (2/(2×N) frequency multiplier) outputs a signal with a frequency 2×fDD. Thus the transmit intermediate frequency fTIF is given by fTIF=3×fDD, and the receive intermediate frequency fRIF is given by fRIF=2×fDD. The oscillation frequency fVCO1 of a VCO 1 is fCH. The transmit frequency fT is given by fT=fCH+fTIF=fCH+3×fDD. The circuit can prevent a transmission spurious problem to its own reception band.

7 Claims, 29 Drawing Sheets

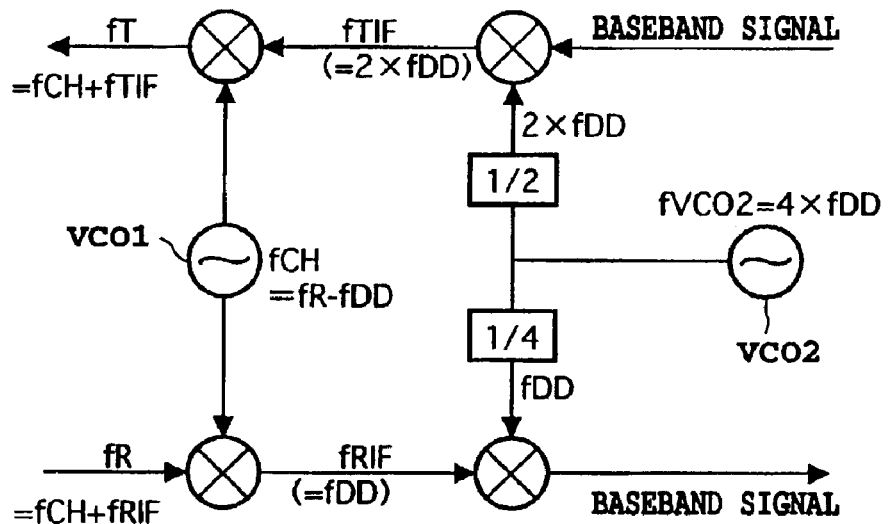
FIG.5A
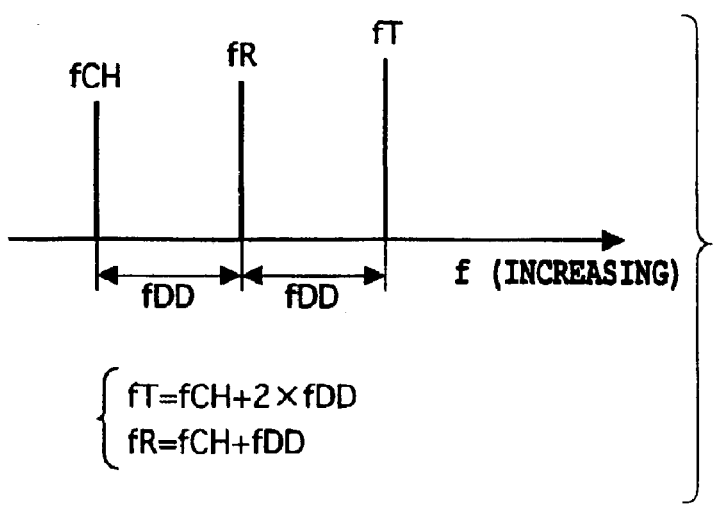
FIG.5B
FIG.5C

COMMUNICATION DEVICE

TECHNICAL FIELD

The present invention relates to a communication apparatus, a transmit frequency fT and a receive frequency fR of which have a difference fDD.

BACKGROUND ART

As one of radio communication schemes, a duplex (full duplex) scheme with a transmit frequency fT and a receive frequency fR is known. A communication apparatus used for this type of a scheme modulates the carrier by a baseband signal to be transmitted (transmit frequency fT), and extracts the baseband signal by demodulating the received wave (receive frequency fR). The transmission uses not only a direct modulation scheme that modulates the carrier directly by the baseband signal, but also an indirect modulation scheme that converts the baseband signal to an intermediate frequency signal with a frequency fTIF, followed by frequency conversion to generate a transmit wave with the frequency fT. On the other hand, although the reception usually employs the so-called superheterodyne scheme, an indirect demodulation scheme using the intermediate frequency (frequency fRIF), it sometimes employs a direct demodulation scheme that demodulates the incoming wave directly at the carrier frequency.

Even when this type of communication apparatus employs the direct modulation scheme, it is unusual to oscillate the signal with the transmit frequency fT directly by a VCO (voltage-controlled oscillator). The signal with the frequency fT is usually generated by oscillating two frequencies independently using two VCOs, followed by mixing them with a mixer. This is because when generating the signal with the frequency fT directly by a single VCO, the unmodulated signal component (carrier component) of the same frequency leaks out of the circuit, causing communication interference. Thus, to reduce the carrier leakage, the configuration using the two VCOs is employed.

On the other hand, at the receiving side, the superheterodyne scheme converts the incoming wave with the receive frequency fR to the intermediate frequency (frequency fRIF) with a mixer using a first VCO, removes undesired waves with a filter, and then extracts the baseband signal using a second VCO (oscillation frequency fRIF). In the direct demodulation scheme also, the local signal (with the same frequency as the incoming wave carrier frequency fR) used for demodulation is usually generated by oscillating two frequencies by two independent VCOs, followed by mixing them to generate the signal with the frequency fR. This is because generating the frequency fR by a single VCO can arise various problems owing to the circulation of the signal within the apparatus.

Thus, regardless of the indirect or direct modulation and demodulation scheme, both the transmitting and receiving sides require two VCOs each. An actual communication apparatus, however, usually uses three VCOs by sharing one of the four VCOs in order to simplify the apparatus and to increase efficiency of the frequency channel selection operation.

FIG. 1 shows a conventional communication apparatus using the indirect modulation scheme, and FIG. 2A shows a conventional communication apparatus employing the direct modulation scheme. As clearly seen from these figures, they use three VCOs (VCO1–VCO3) each. FIG. 2B shows a configuration in which a receiving system uses the direct scheme as well.

It is assumed in FIG. 1 and FIGS. 2A and 2B that the transmit frequency fT is higher than the receive frequency fR, and the frequency difference between them is fDD. Assume further that the frequency of the shared VCO 1 is fCH, and that the oscillation frequencies of the VCO 2 and VCO 3 used for the transmission and reception are fTIF and fRIF, respectively, regardless of the direct or indirect modulation and demodulation. Then, the following expressions hold.

$$fCH = fT \pm fTIF$$

$$fCH = fR \pm fRIF$$

where $$fT = fR + fDD$$

To select the frequencies fCH, fTIF and fRIF satisfying the foregoing expressions, it is necessary for an actual system to prevent spurious components, which are caused by combinations of harmonics of the oscillation frequencies, from overlapping on the transmission band or reception band. Furthermore, as with the superheterodyne scheme, a desired combination of the frequencies fCH, fTIF and fRIF satisfying the foregoing expressions is usually selected considering practically important conditions such as selecting the frequency fRIF that will facilitate implementing a filter for the frequency fRIF.

As for the communication apparatus including a lot of channels as its transmission channels and reception channels, the oscillation frequency fCH is made variable for the channel selection, and the frequencies fTIF and fRIF are fixed to simplify the apparatus.

The conventional system configurations as shown in FIG. 1 and FIGS. 2A and 2B have an advantage of having a high degree of flexibility in selecting the fCH, fTIF and fRIF, and of being able to handle the spurious problem and the like with ease, although they require three VCOs.

However, requiring three VCOs is undesirable for a mobile communication apparatus that demands to be compact and lightweight, low current consumption and low cost.

In view of this, a configuration as shown in FIG. 3A is conceived to implement a communication scheme requiring only two VCOs and having a frequency difference fDD (Hz) between the transmit frequency and receive frequency, for example.

Incidentally, although the indirect scheme is used for the transmission and reception for the sake of description in the accompanying drawings, the present invention is also applicable in exactly the same manner to the case where one of the transmission and reception or both of them use the direct scheme as described above in connection with FIG. 1 and FIGS. 2A and 2B.

Assume that the oscillation frequencies of the two VCOs are fVCO1 and fVCO2, then the following equations hold.

$$fVCO1 = fCH = fR + (2 \times fDD)$$

$$fVCO2 = 2 \times fDD$$

This means that the frequencies fTIF=fDD and fRIF=2× fDD are selected. However, the configuration as shown in FIGS. 3A–3C has a problem in that a certain transmission signal has a spurious component overlapping on the reception band. Specifically, one of the spurious components of the transmission signal consisting of a combination of the fundamental fCH and the second harmonic fTIF falls exactly on the receive frequency as given by the following equation.

$$fCH-(2\times fTIF)=(fR+(2\times fDD))-2\times fDD=fR$$

Thus, since the spurious component of the transmission signal exactly agrees with the receive frequency, circulation occurs from a transmitting side circuit to a receiving side circuit within the apparatus, thereby causing extra noise. In addition, this also presents a problem of sending an interference wave to other communication apparatuses.

In brief, although the example of FIGS. 3A–3C has an advantage of being able to simplify the configuration by using the two VCOs and one frequency divider, it has an unavoidable problem concerning the frequencies.

FIGS. 4A–4C show an example that selects the frequencies such that fVCO2=4×fDD holds. In this case, to establish the relationships fTIF=fDD and fRIF=2×fDD as in FIGS. 3A–3C, a transmitting side mixer is supplied with the output of a divide-by-4 circuit (frequency fDD), and a receiving side mixer is supplied with the output of a divide-by-2 circuit (frequency 2×fDD). However, the example also has a problem in that one of the spurious components of the transmission signal exactly agrees with the receive frequency as described above in connection with FIGS. 3A–3C.

FIGS. 5A–5C show an example that selects the frequency fVCO2 satisfying the relationship fVCO2=4×fDD as in FIGS. 4A–4C. However, to establish the relationships fTIF=2×fDD and fRIF=fDD, the transmitting side mixer is supplied with the output of the divide-by-2 circuit (frequency 2×fDD), and the receiving side mixer is supplied with the output of the divide-by-4 circuit (frequency fDD). In this example, the problem in that the spurious component of the transmission signal exactly agrees with the receive frequency does not occur.

Furthermore, FIGS. 6A–6C show an example from which the two frequency dividers of FIGS. 4A–4C or FIGS. 5A–5C are removed. In this example, the VCO 1 and VCO 2 have the following oscillation frequencies.

$$fVCO1=fCH=fR+(\tfrac{1}{2}\times fDD)$$

$$fVCO2=\tfrac{1}{2}\times fDD$$

Accordingly, the relationships fRIF=fTIF=½×fDD hold. Thus, it is possible to make the frequency fT higher than fR by fDD by selecting the fT=fCH+fTIF and fR=fCH−fRIF side mixing components.

In this case, however, the spurious problem is more serious, resulting in that the sideband unnecessary for the transmission overlaps on the reception band strongly.

As described above, although various apparatuses are conceivable which generate the transmit frequency fT and receive frequency fR using only two VCOS, the configurations other than the configuration of FIGS. 5A–5C have a transmission spectrum that overlaps on the reception band, thereby offering a problem of little practical utility.

FIGS. 5A–5C show the only one configuration serving practical use without the transmission spurious problem among the simple configurations briefed above. However, the system whose acceptable frequencies fT and fR (and hence fDD) are determined, has no other options even if the frequency structure has a problem. For example, when it is difficult to implement a compact and practical superheterodyne IF filter at the frequency fRIF (=fDD), it is fatal for the two-VCO configuration not to have other alternative.

In view of the foregoing problems, an object of the present invention is to provide a communication apparatus capable of generating the transmission signal and reception signal using two oscillators, and of preventing a harmful spurious component from being generated even with a configuration other than that of FIGS. 5A–5C.

Generally speaking, greater use of complicated frequency conversions can enable other configurations with two VCOs. However, complicated frequency conversions will make the system worse than the systems with three VCOs in terms of compactness, light weight, low power consumption and low cost, which will make the present invention nonsense.

Therefore another object of the present invention is to provide a communication apparatus whose frequency converters, which are necessary to achieve the foregoing object, have a simple configuration.

DISCLOSURE OF THE INVENTION

To accomplish the objects described above, according to an aspect of the present invention associated with claim 1, there is provided a communication apparatus, a transmit frequency fT and a receive frequency fR of which has a difference fDD, the communication apparatus comprising: a first oscillator for generating a first oscillation signal with an oscillation frequency N×(M×fDD), where N is an integer equal to or greater than one and M is an integer equal to or greater than two; a frequency converter receiving the first oscillation signal, for converting it to a first signal with an output frequency fTIF, where fTIF=(M+1)×fDD or fTIF=M×fDD, and to a second signal with an output frequency fRIF, where fRIF=M×fDD when fTIF=(M+1)×fDD, and fRIF=(M+1)×fDD when fTIF=M×fDD; a second oscillator with an oscillation frequency fCH, where fCH=fT±fTIF or fCH=fR±fRIF; a transmitting mixer for outputting a transmission signal with a frequency fT by receiving a baseband signal to be transmitted, the first signal with the frequency fTIF output from the frequency converter, and a signal with the frequency fCH output from the second oscillator; and a receiving mixer for outputting the baseband signal received by receiving a reception signal with a frequency fR, a signal with the frequency fCH output from the second oscillator, and the second signal with the frequency fRIF output from the frequency converter.

According to an aspect of the present invention associated with claim 2, the integer M may be two in the communication apparatus as defined in claim 1.

According to an aspect of the present invention associated with claim 3, the integer N may be equal to or greater than two in the communication apparatus as defined in claim 1 or 2.

According to an aspect of the present invention associated with claim 4, in the communication apparatus as defined in claim 3, the frequency converter may use when converting to the first signal with the output frequency fTIF: an (M+1)/(N×2) frequency multiplier when converting to fTIF=(M+1)×fDD; and a divide-by-K circuit when converting to the frequency fTIF=M×fDD, where K, which is an integer equal to or greater than two, is given by K=(N×M)/2, and wherein the frequency converter may use when converting to the second signal with the output frequency fRIF: a divide-by-K circuit when converting to the frequency fRIF=M×fDD; and an (M+1)/(N×2) frequency multiplier when converting to the frequency fRIF=(M+1)×fDD.

According to an aspect of the present invention associated with claim 5, in the communication apparatus as defined in claim 4, the integers N and M may be selected such that G=(N×2)/M becomes an integer equal to or greater than two, and the (M+1)/(N×2) frequency multiplier may comprise: a divide-by-M circuit for dividing the frequency of the input signal to generate an M frequency division wave; a mixer receiving the input signal and the M frequency division wave of the input signal, for multiplying the frequency of the input signal by (M+1)/M; and a divide-by-G circuit for dividing the output frequency of the mixer by G.

According to an aspect of the present invention associated with claim 6, in the communication apparatus as defined in claim 5, the mixer may carry out single sideband mixing as its mixing operation, and selectively generate a frequency equal to the input frequency multiplied by (M+1)/M.

According to an aspect of the present invention associated with claim 7, the integer N may be two or four in the communication apparatus as defined in any one of claims 1–6.

BRIEF DESCRIPTION OF THE DRAWINGS

FIGS. 5A–5C are diagrams showing still another communication apparatus constituting a premise of the present invention;

BEST MODE FOR CARRYING OUT THE INVENTION

The embodiments in accordance with the invention will now be described in detail with reference to the accompanying drawings.

Figure 1:
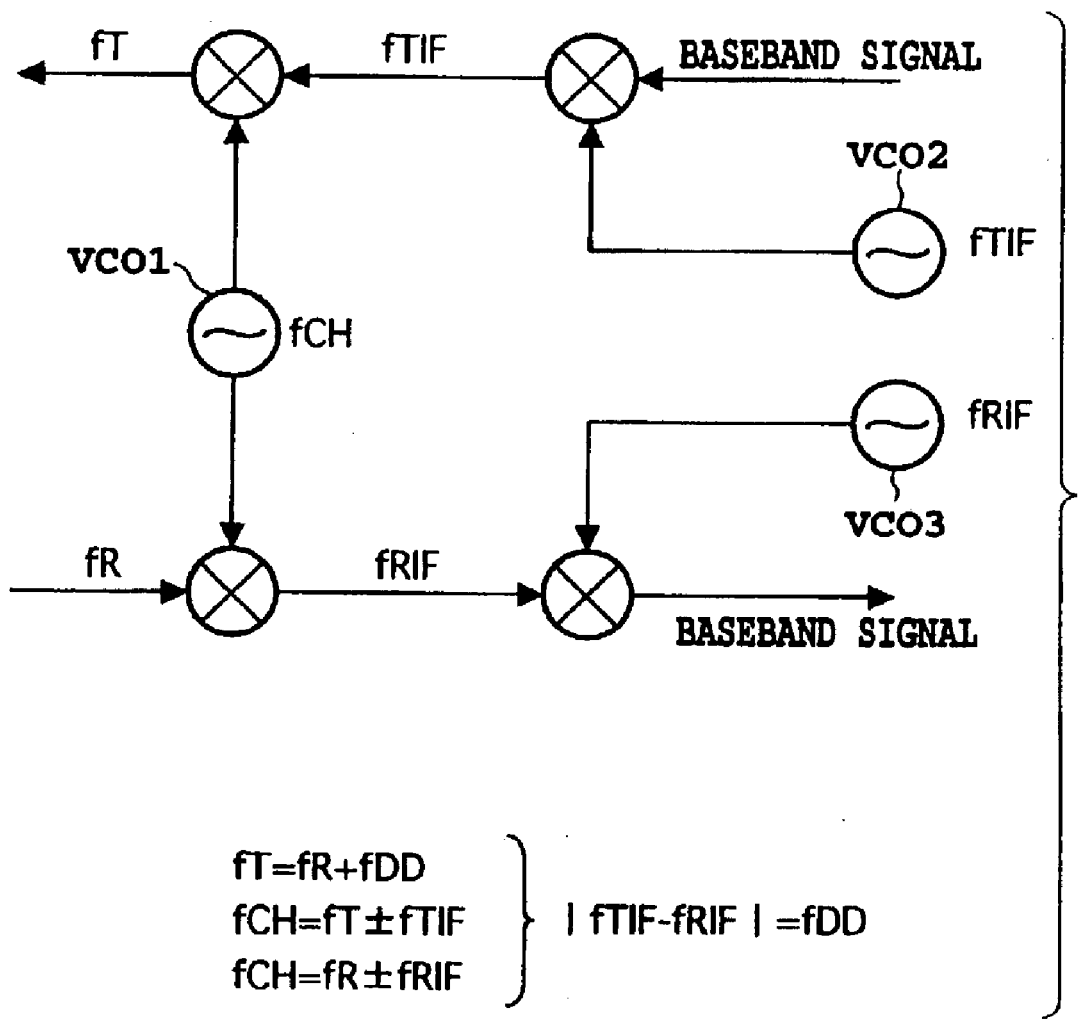
FIG. 1 is a block diagram showing a configuration of a conventional technique.
Figure 2A:
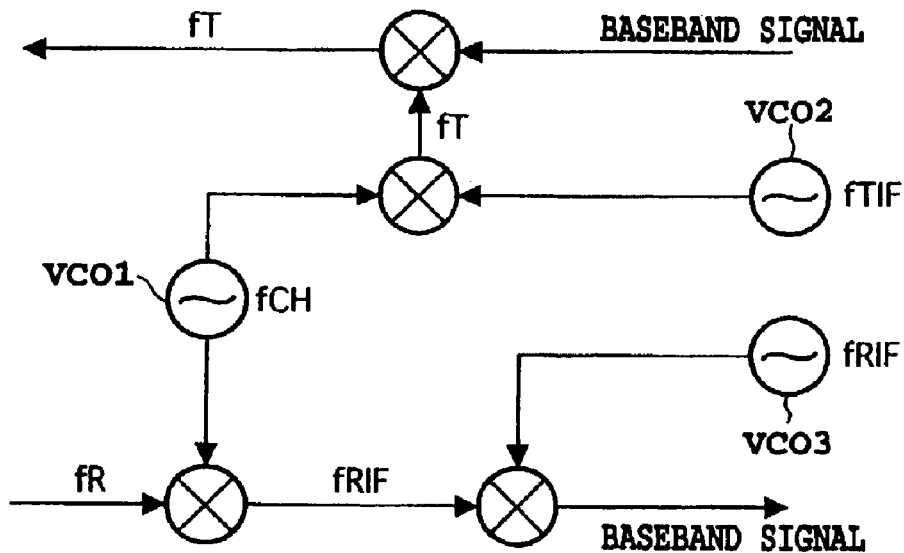
FIGS. 2A and 2B are block diagrams each showing another configuration of a conventional technique.
Figure 2B:
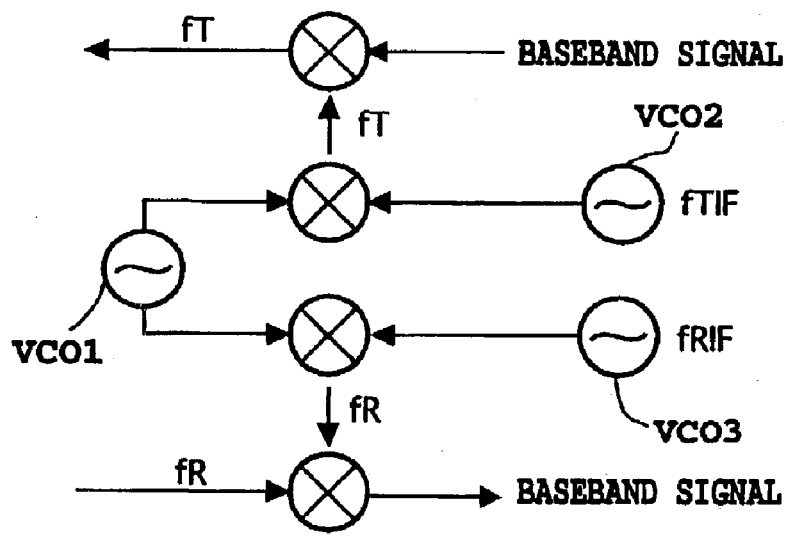
Figure 3A:
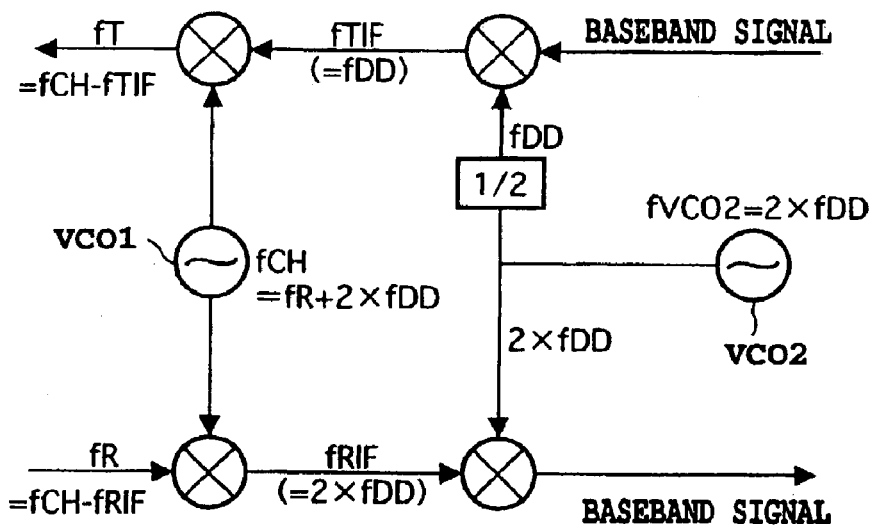
FIGS. 3A–3C are diagrams showing a communication apparatus making a premise of the present invention.
Figure 3B:
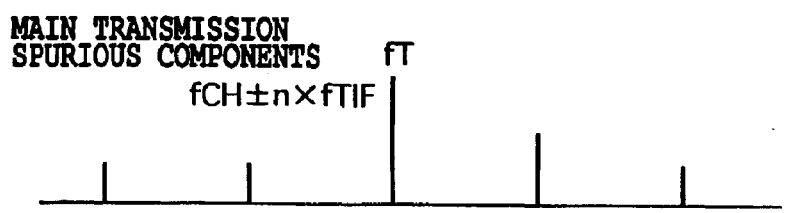
Figure 3C:
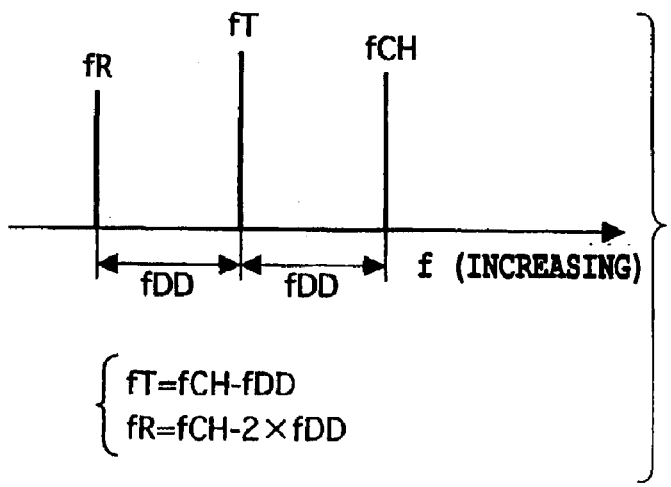
Figure 4A:
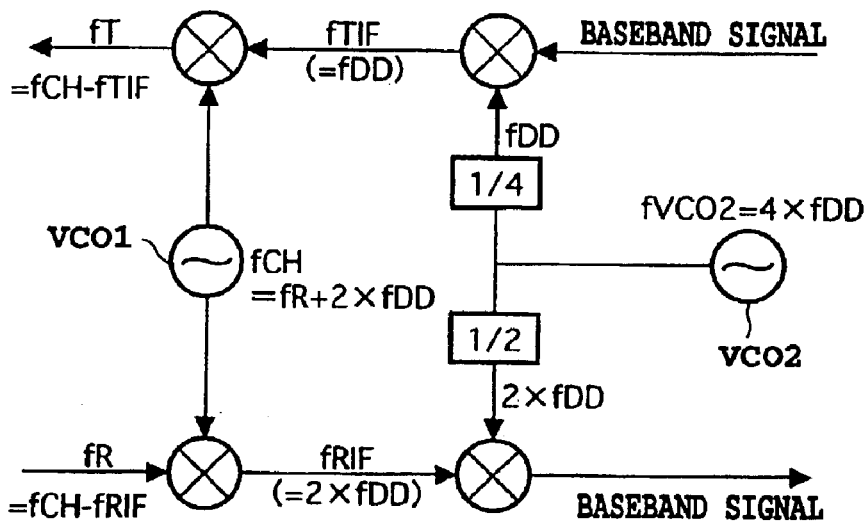
FIGS. 4A–4C are diagrams showing another communication apparatus constituting a premise of the present invention.
Figure 4B:
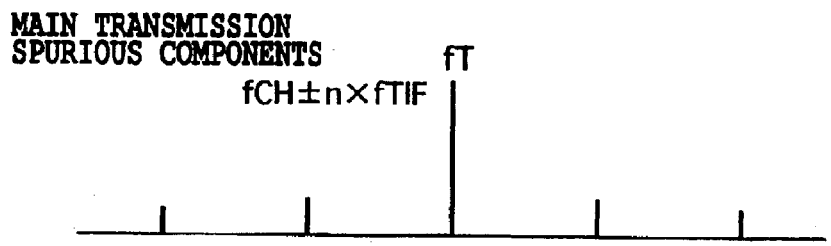
Figure 4C:
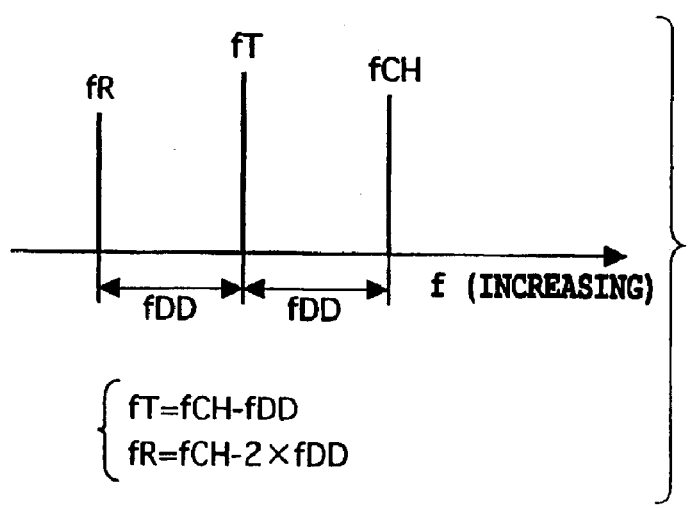
Figure 6A:
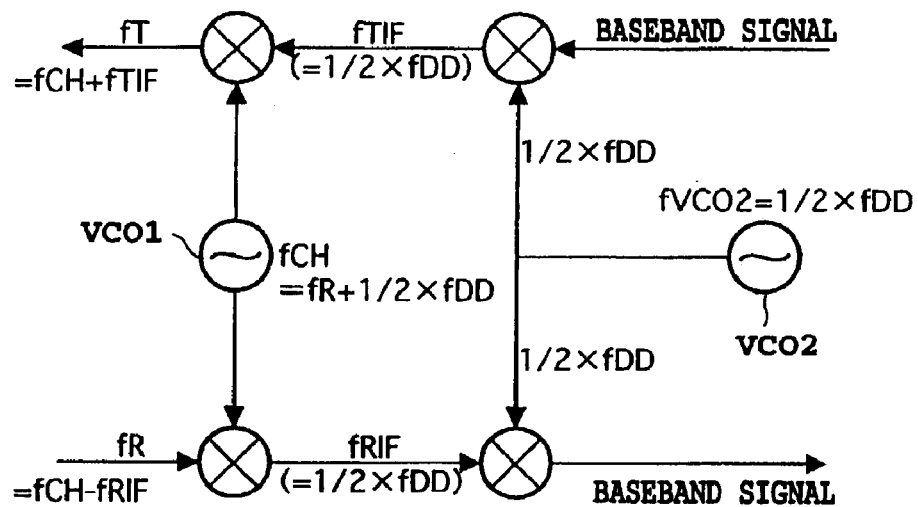
FIGS. 6A–6C are diagrams showing another communication apparatus constituting a premise of the present invention.
Figure 6B:
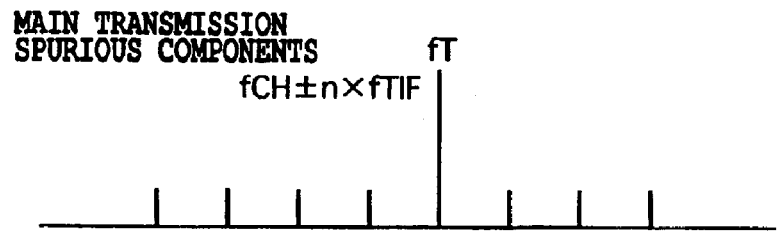
Figure 6C:
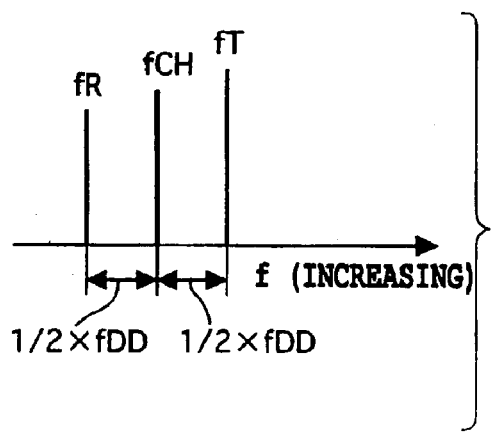
Figure 7:
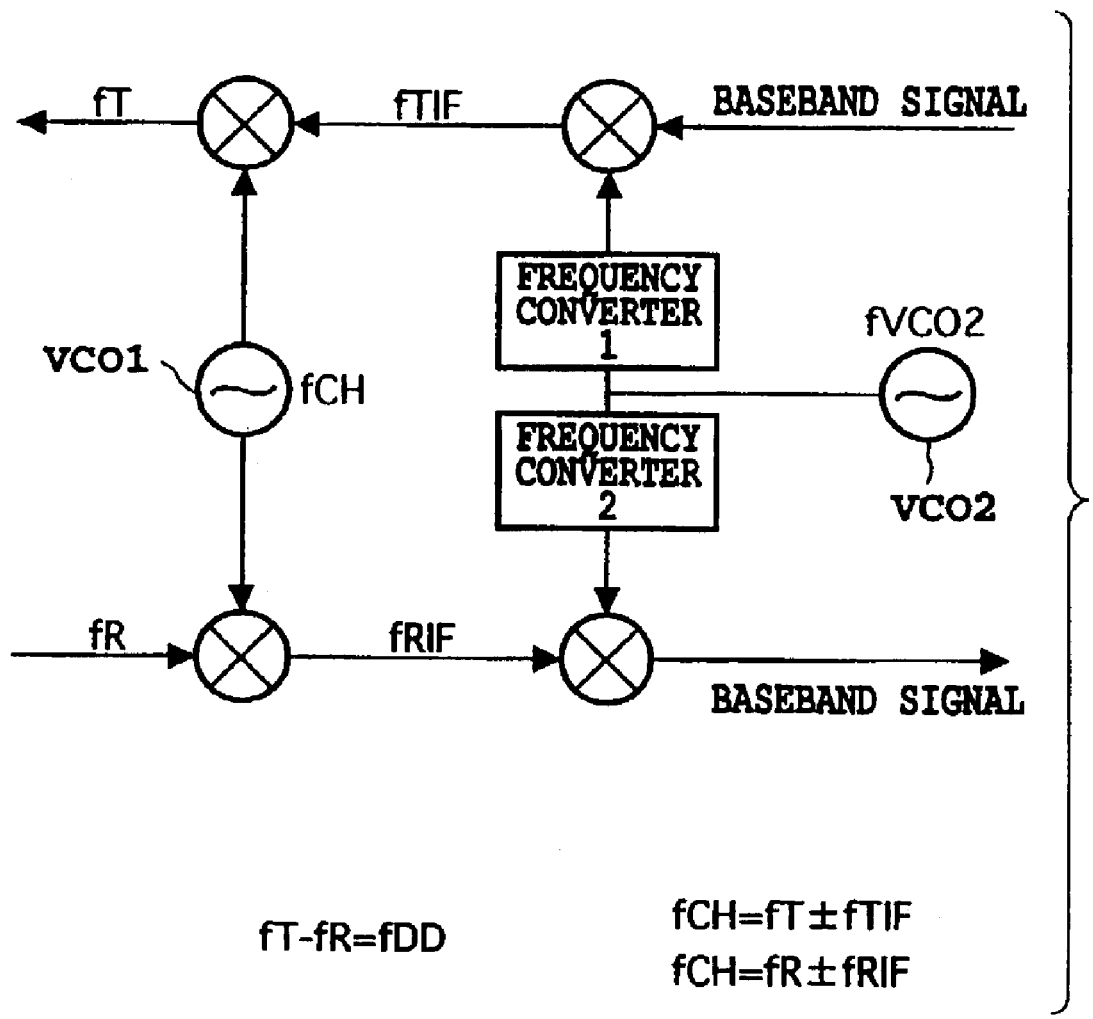
FIG. 7 is a block diagram showing a general configuration of the embodiments of the communication apparatus in accordance with the present invention.

FIG. 7 is a block diagram showing a generalized circuit configuration of the individual embodiments in accordance with the present invention. A first VCO 1 in FIG. 7 is used in common for transmission and reception as that of the conventional 3-VCO configuration (see, FIGS. 1 and 2), and its oscillation frequency is represented by fCH (fVCO1=fCH) as in FIGS. 1 and 2. To use a second VCO 2 in common for transmission and reception, it is necessary to achieve the frequency difference fDD at the transmit intermediate frequency fTIF and receive intermediate frequency fRIF. Thus, a frequency converter 1 and frequency converter 2 are used which will be described in detail later.

Next, the embodiments that specify the oscillation frequencies of the individual VCOs and conversion characteristics of the individual frequency converters will be described. For the sake of simplifying description and understanding, the following restrictions will be added. As for the aspects of the invention as defined in claims 2 and 3 dependent from claim 1 and confined to M=2 and N≧2, they will be described first. Subsequently, it will be described in the embodiment 6 and onward that the present invention is effective when N=1 or when M is equal to or greater than three. Accordingly, the description before the embodiment 6 assumes a premise that M=2.

Embodiment 1

Figure 8A:
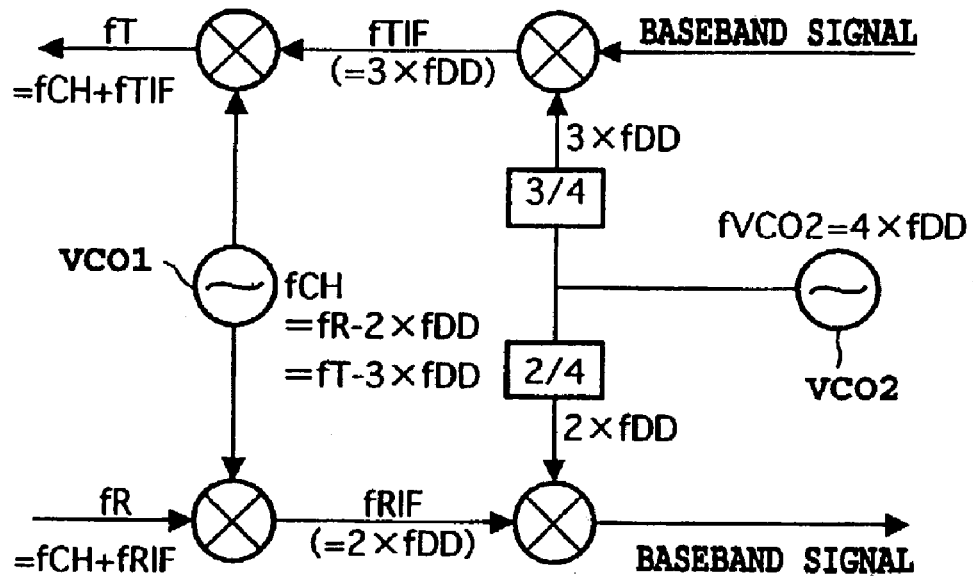
FIGS. 8A and 8B are diagrams showing a first embodiment.
Figure 8B:
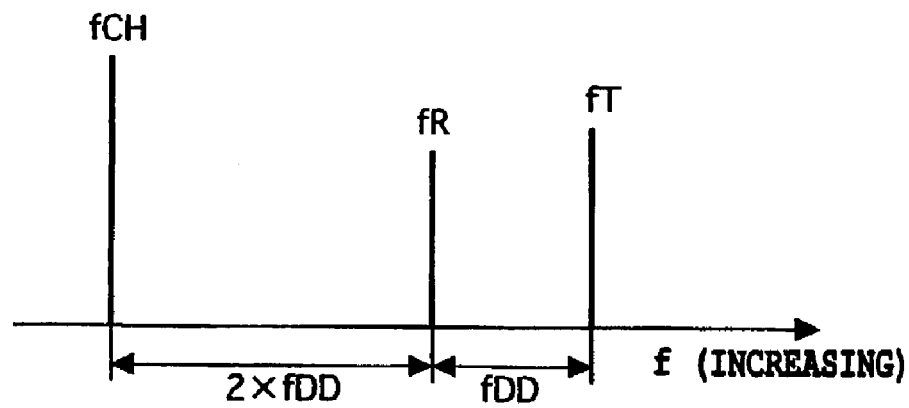

FIGS. 8A and 8B is a block diagram showing a configuration of a first embodiment. In the present embodiment, the oscillation frequency fVCO2 of the VCO 2 is given by fVCO2=4×fDD, where fDD is the difference (fDD=fT−fR) between the transmit frequency fT and receive frequency fR as before.

As the two frequency converters, the present embodiment employs a ¾ frequency multiplier and a ²⁄₄ frequency multiplier (that is, a divide-by-2 circuit). Thus, the ¾ frequency multiplier outputs a signal with a frequency 3×fDD, and the ²⁄₄ frequency multiplier outputs a signal with a frequency 2×fDD. Consequently, the transmit intermediate frequency fTIF is given by fTIF=3×fDD, and the receive intermediate frequency fRIF is given by fRIF=2×fDD.

The oscillation frequency fVCO1 of the VCO 1 is fCH. Accordingly, the transmit frequency fT is given by fT=fCH+fTIF=fCH+3×fDD. In addition, the receive frequency fR is given by fR=fCH+fRIF=fCH+2×fDD. Consequently, the difference between the transmit frequency fT and receive frequency fR (fT>fR) is fDD.

In other words, the oscillation frequency fCH of the VCO 1 is given by fCH=fT−3×fDD=fR−2×fDD.

The spectra of individual signals of the present embodiment are illustrated in FIG. 8B. Referring to this figure, it will be explained that the present embodiment has no reception band spurious problem.

When placing the transmitting side intermediate frequency fTIF at 3×fDD, a spurious component at the transmission output terminal is given by the following expression in general.

$$N \times fCH + m \times (3 \times fDD)$$

n: positive integer, and m: integer.

When n=m=1, the spurious component becomes the target transmit frequency fT.

On the other hand, the receive frequency fR is given by fR=fCH+(2×fDD) in this case. No matter how n and m of the foregoing expression are selected, the receive frequency fR is not output from the transmitting side in general except for such a particular case as the fCH exactly agrees with the integer multiple (five times, for example) of the fDD. Thus, to circumvent the reception band spurious problem, there are countless selection methods for setting the fRIF and fTIF at integer multiples of the fDD. The present embodiment selects the simplest couple of fRIF and fTIF to simplify the two frequency converters. As a result, it can implement an apparatus configuration with high practical utility and without the reception band spurious problem.

Embodiment 2

Figure 9A:
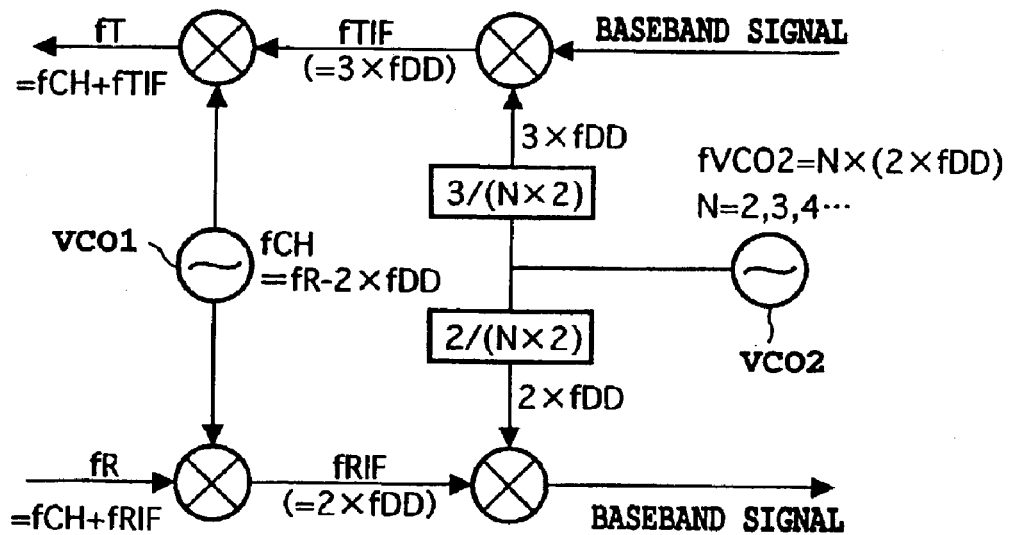
FIGS. 9A and 9B are diagrams showing a second embodiment with a circuit configuration generalizing that of FIGS. 8A and 8B.
Figure 9B:
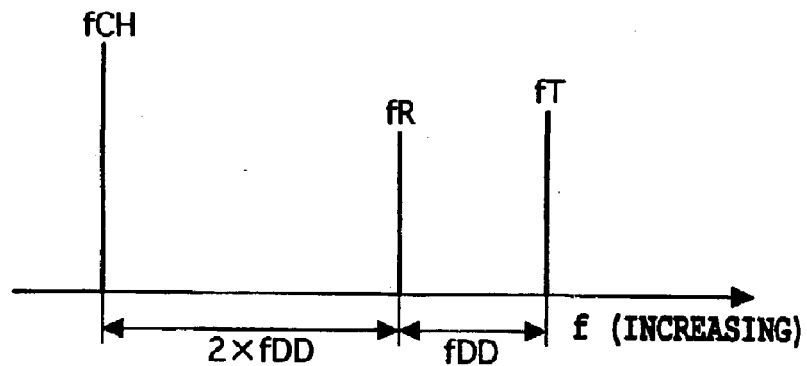

FIGS. 9A and 9B show a second embodiment, a more general circuit configuration of FIGS. 8A and 8B. It is the same in the present embodiment that the equations fTIF=3×fDD and fRIF=2×fDD hold, and the oscillation frequency of the VCO 1 is given by fCH. In addition, it is the same that the transmit frequency is given by fT=fCH+fTIF=fCH+3×fDD, and the receive frequency is given by fR=fCH+fRIF=fCH+2×fDD. Thus, the difference between the transmit frequency fT and receive frequency fR (fT>fR) is also fDD.

The present embodiment differs from the foregoing embodiment 1 in that the oscillation frequency fVCO2 of the VCO 2 is given by fVCO2=N×(2×fDD), where N is an integer equal to and greater than two. To achieve fTIF=3×fDD, the present embodiment employs a 3/(N×2) frequency multiplier as the frequency multiplier. Likewise, to achieve fRIF=2×fDD, it employs a 2/(N×2) frequency multiplier as the frequency multiplier. Accordingly, placing N=2 will reduce the present embodiment to the circuit as shown in FIGS. 8A and 8B.

The present embodiment can also implement the apparatus configuration without the reception band spurious problem.

Embodiment 3

Figure 10A:
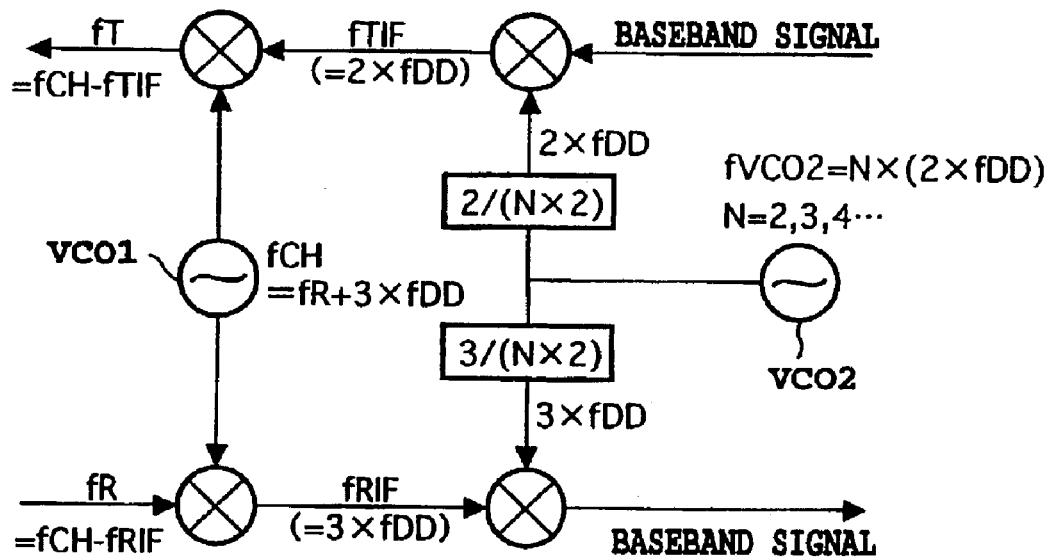
FIGS. 10A and 10B are diagrams showing a third embodiment in which the positions of frequency multipliers of FIGS. 9A and 9B are exchanged.
Figure 10B:
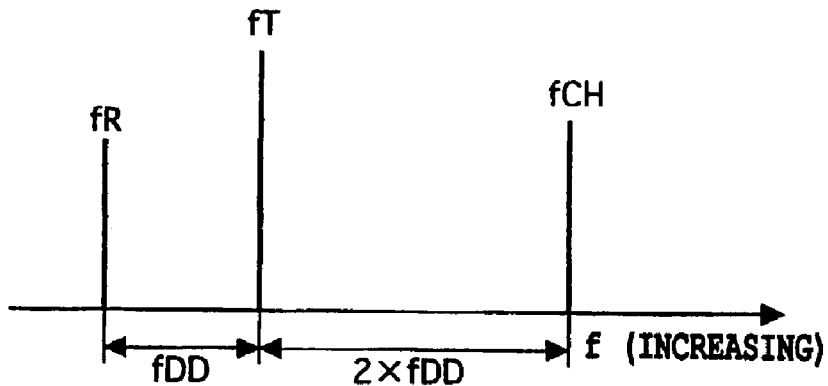

FIGS. 10A and 10B show a third embodiment in which the positions of the frequency multipliers as shown in FIGS. 9A and 9B are exchanged. Since the oscillation frequency fVCO2 of the VCO 2 is maintained at fVCO2=N×(2×fDD) in the present embodiment, the fTIF and fRIF are given by fTIF=2×fDD and fRIF=3×fDD. To establish the difference between the transmit frequency fT and receive frequency fR (fT>fR) at fDD, the oscillation frequency fCH of the VCO 1 is set at fCH=fT+2×fDD=fR+3×fDD. As a result, the transmit frequency is given by fT=fCH−2×fDD=fCH−fTIF, and the receive frequency is given by fR=fCH−3×fDD=fCH−fRIF (fT>fR).

The present embodiment can also implement the apparatus configuration without the reception band spurious problem.

Embodiment 4

Although it is assumed in the foregoing embodiments 1–3 that the transmit frequency fT is greater than the receive frequency fR (fT>fR), the present invention is applicable to the opposite case where fT<fR in just the same manner.

Figure 11:
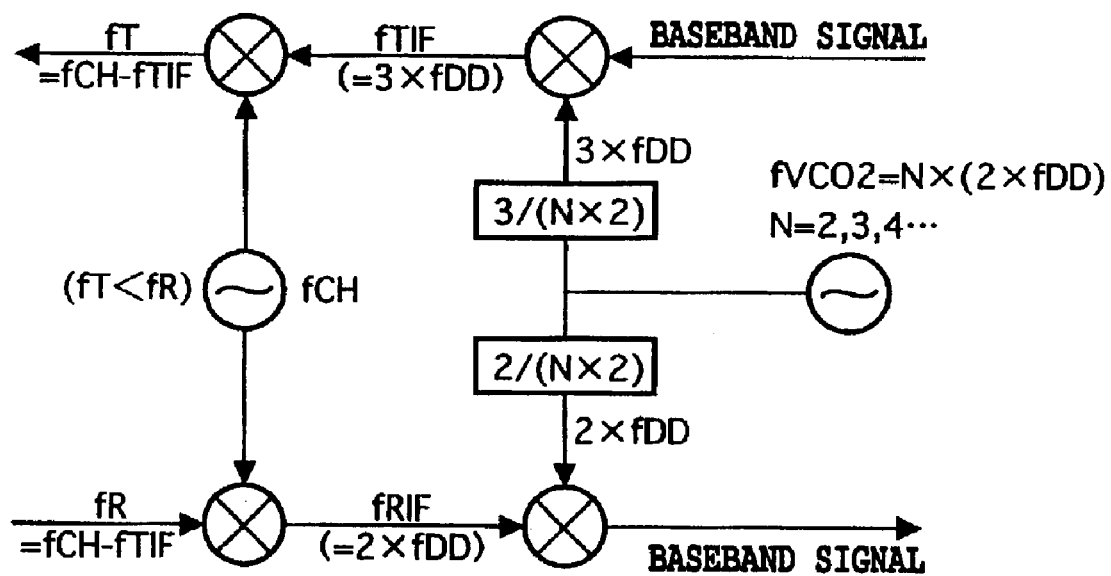
FIG. 11 is a block diagram showing a configuration of a fourth embodiment having the same circuit configuration as FIGS. 9A and 9B.

FIG. 11 shows a fourth embodiment with the same circuit configuration as that of FIGS. 9A and 9B. In the present embodiment, the transmit frequency is given by fT=fCH−fTIF=fCH−3×fDD, and the receive frequency is given by fR=fCH−fRIF=fCH−2×fDD, where fR−fT=fDD (fT<fR).

Embodiment 5

Figure 12:
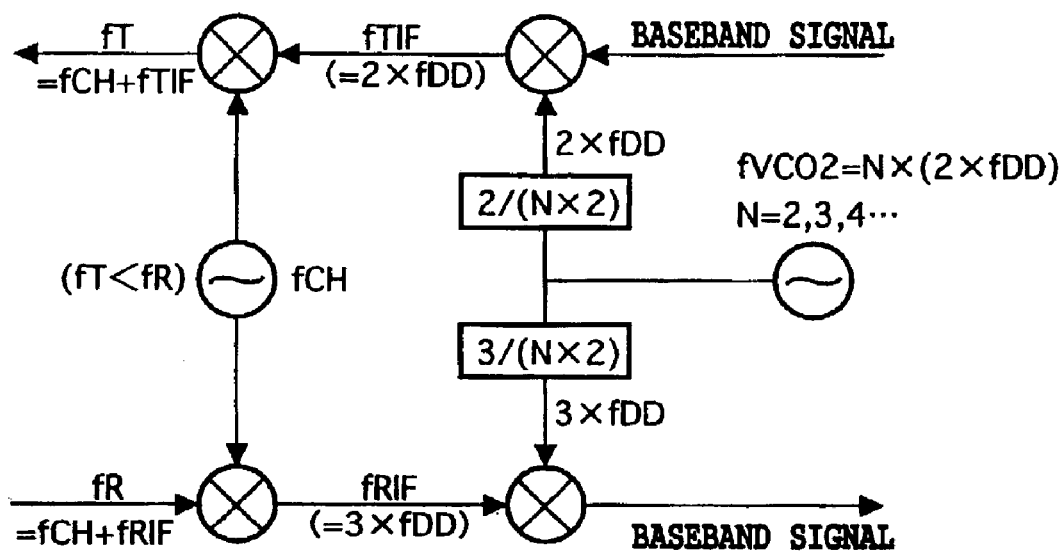
FIG. 12 is a block diagram showing a configuration of a fifth embodiment having the same circuit configuration as FIGS. 10A and 10B.

FIG. 12 shows a fifth embodiment with the same circuit configuration as that of FIGS. 10A and 10B. In the present embodiment, the transmit frequency is given by fT=fCH+fTIF=fCH+2×fDD, and the receive frequency is given by fR=fCH+fRIF=fCH+3×fDD, where fR−fT=fDD (fT<fR).

About Frequency Converter (Frequency Multiplier)

Next, a detailed circuit configuration of the frequency converters (frequency multipliers) used by the foregoing embodiments will be described. When the integer N is three or a multiple of three (L×3, where L is an integer equal to or greater than one), the two frequency converters in accordance with the present invention require a 1/(2×L) frequency conversion for generating 3×fDD, and a 1/(3×L) frequency conversion for generating 2×fDD. Since both the converters can be implemented by a known frequency divider using flip-flops, the present invention can be carried out easily. When N is not a multiple of three, a 3/(N×2) frequency conversion for generating 3×fDD cannot be a frequency divider itself. Thus, it will be described below. For the sake of simplicity, it will be described when N=2 as shown in FIGS. 8A and 8B. Incidentally, the ¾ frequency multiplier as shown in FIGS. 8A and 8B is a divide-by-2 circuit which can be implemented by a known frequency divider using flip-flops.

Figure 13:
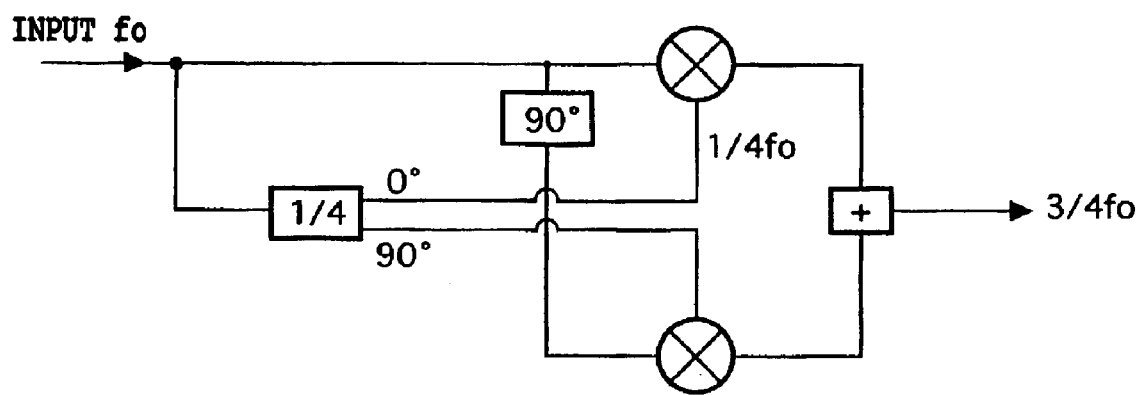
FIG. 13 is a block diagram showing a configuration of a ¾ frequency multiplier.

About Frequency Converter (Multiplier) as Shown in FIG. 13

It splits the input signal (frequency $f_0$) into two paths, and mixes the first path with the second path passing through the frequency division by four, thereby generating a signal with a frequency $(1-¼)×f_0$, that is, a signal subjected to the ¾ frequency conversion. FIG. 13 shows a case of an SSB configuration.

Figure 14:
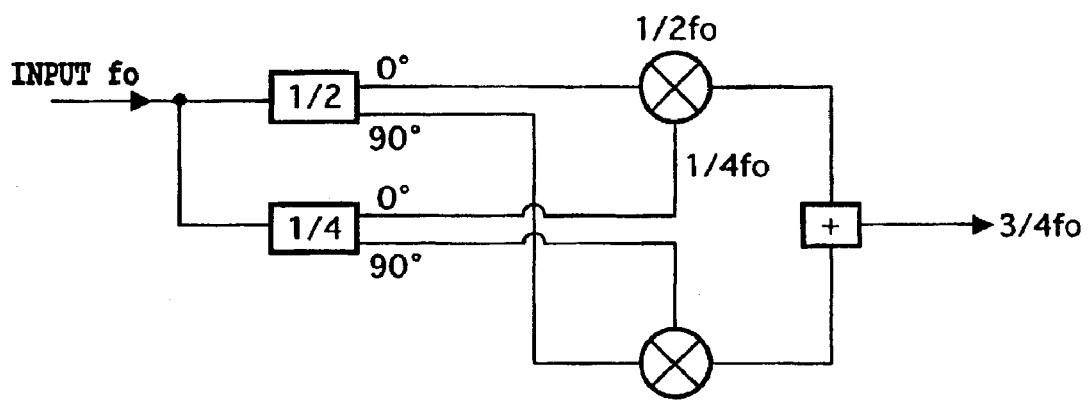
FIG. 14 is a block diagram showing another configuration of the ¾ frequency multiplier.

About Frequency Converter (Multiplier) as Shown in FIG. 14

It splits the input signal (frequency $f_0$) into two paths, and mixes the first path passing through the frequency division by two with the second path passing through the frequency division by four, thereby generating a signal with a frequency $(½+¼)×f_0$, that is, a signal subjected to the ¾ frequency conversion. FIG. 14 shows a case of an SSB configuration.

Figure 15:
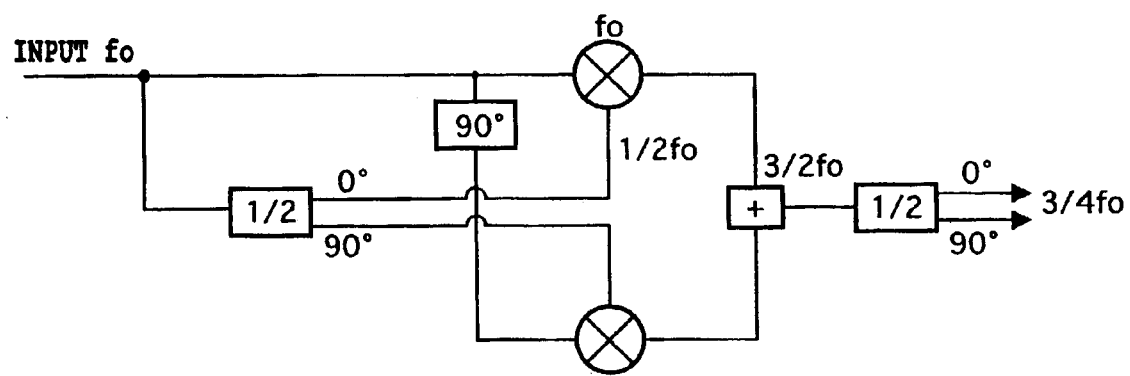
FIG. 15 is a block diagram showing still another configuration of the ¾ frequency multiplier.

About Frequency Converter (Multiplier) as Shown in FIG. 15

It splits the input signal (frequency $f_0$) into two paths, and mixes the first path with the second path passing through the frequency division by two, thereby generating a signal with a frequency $(1+½)f_0$, that is, a signal subjected to the 3/2 frequency conversion. Subsequently, the signal is passed through a divide-by-2 circuit to generate the signal subjected to the ¾ frequency conversion. FIG. 15 shows a case of an SSB configuration.

Thus, the two frequency converters in accordance with the present invention can be implemented with a simple configuration. Accordingly, the two-VCO type communication apparatus in accordance with the present invention has a very high practical utility in terms of compactness, lightweight, low power consumption and low cost.

In the present invention, the two frequency converters are connected to mixers in a wide sense including modulator and demodulator. These mixers are preferably a mixer that has two inputs with 90 degree phase difference in a practical circuit. In particular, when N is an even integer, two signals with 90 degree phase difference can be extracted easily from a frequency divider. Thus, the two signals with 90 degree phase difference can be supplied to the mixers without adding any new phase shifters. In view of this, the present invention is particularly useful when N is even. Furthermore, since the frequency converters are simple when N is 2 or 4, the present invention is particularly effective in this case.

The present invention is effective regardless of the configuration of the frequency converters used. The three examples of the ¾ frequency converter (frequency multiplier) described above are only examples to explain the practical utility of the present invention, and hence the present invention is not limited to these circuits. However, the frequency multiplier as shown in FIG. 15 is particularly effective as the ¾ frequency multiplier in accordance with the present invention (the reason will be described later).

As described above, the present invention offers an advantage of being able to reduce the reception band spurious problem. This aspect will be described in more detail considering actual operation of a practical circuit.

According to the present invention, the reception band spurious problem is solved by placing the ratio between the two IF frequencies (fTIF and fRIF) with the frequency difference fDD at 2:3 rather than 1:2 in generating the two frequencies. To achieve this the ¾ frequency converters are used.

In the practical circuits as described above in connection with FIGS. 13–15, however, there are often secondary frequencies besides the signal after the ¾ frequency conversion. Among them, when the frequency ¼×$f_0$ is produced secondarily with the target frequency ¾×$f_0$, the reception band spurious problem can occur in the present invention. However, it occurs only when the two-VCO type communication apparatus in accordance with the present invention has a configuration having the relationship of fT−fR=fDD, and when the frequency on the fCH=fT−3fDD=fR−2fDD side is selected (see, FIGS. 8A and 8B).

In this case, the transmit frequency fT is generated from the oscillation frequencies (fCH and fVCO2) of the two VCOs in such a manner that equation fT=fCH+(3/(N×2))×fVCO2 holds. When the ¾ frequency converter produces the secondary wave in this case, the transmission spurious component with a frequency fCH+2×(1/(N×2))×fVCO2 is given by the following expression.

$$fCH+2\times(1/(N\times2))\times fVCO2 = fCH+(1/N)\times fVCO2 = fCH+(2\times fDD) = fR$$

Thus, it exactly agrees with the reception band, causing the reception band spurious problem.

To circumvent the problem, a filter inserted after the ¾ frequency multiplier can sufficiently reduce the intensity of the ¼×$f_0$ signal as compared with that of the ¾×$f_0$ signal. Thus, the communication apparatus in accordance with the present invention can achieve its functions effectively.

However, the frequency multiplier as shown in FIG. 15 generates the secondary wave ((¼)×$f_0$) less than the other circuits. Thus it is not necessary to insert the filter, which is particularly advantageous.

As for the mixers in a broad sense including the modulator and demodulator to which the two frequency multipliers (frequency converters) are connected in the present invention, it is preferable that the mixers have two signal inputs with 90 degree phase difference. In this case, the circuit as shown in FIG. 15 has a frequency divider at the final stage. Accordingly, when N is even, it can automatically extract the two signals with the 90 degree phase difference as the output of the divide-by-N circuit. Consequently, it is not necessary to add a new phase shifter, which is more advantageous than the circuit as shown in FIG. 13 or 14.

In summary, the frequency multiplier (frequency converter) as shown in FIG. 15 is particularly effective for implementing the communication apparatus in accordance with the present invention because of the two reasons. First, it generates little (¼)×$f_0$ secondary wave, and second, it can extract the two signals with the 90 degree phase difference without adding any new circuit. In other words, the frequency multiplying method is very useful which carries out the 3/(N×2)×frequency conversion by mixing the input frequency with the input frequency passing through the divide-by-2 frequency division to generate the 3/2×frequency of the input frequency, followed by divide-by-N frequency division.

In addition, when the mixing circuits within the circuit as shown in FIG. 15 is a single sideband mixing circuit, the reduction effect of the (¼)×$f_0$ secondary wave is further improved. In other words, it is preferable for the mixing in the circuit for carrying out the 3/(N×2) frequency conversion (see, FIG. 15) to carry out the single sideband mixing and to selectively generate the 3/2 frequency.

So far, the invention associated with claim 2, that is, when M=2, is described. It solves the reception band spurious problem by placing the ratio between the fTIF and fRIF at 2:3 or 3:2. However, the effect can be achieved by placing the ratio between the fTIF and fRIF not only at 2:3, but also at M:(M+1) or (M+1):M in general, where M is an integer equal to or greater than two. Before describing this, however, since the case where N=1 has not been described up to now, it will be described first.

Embodiment 6

Figure 16:
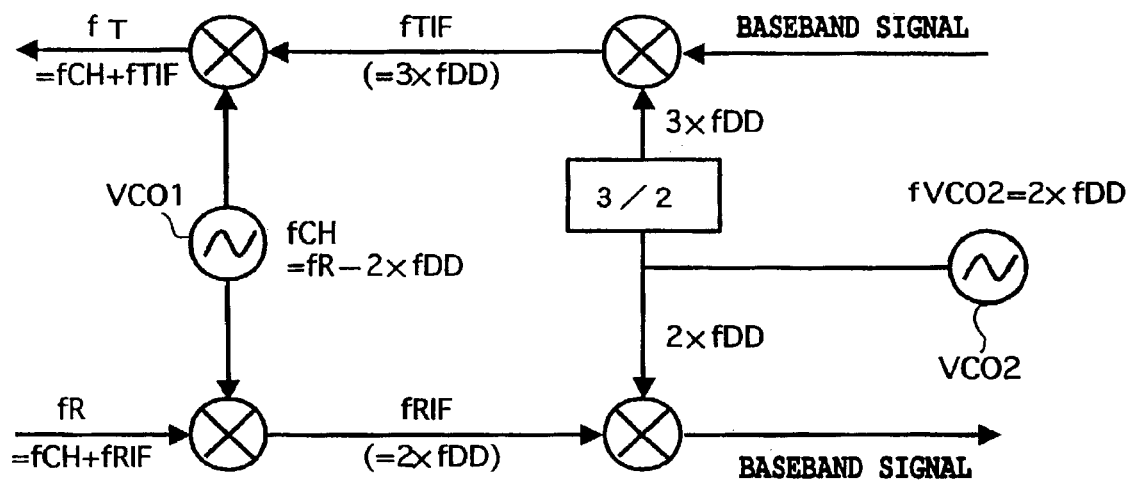
FIGS. 16, 17, 18, 19 and 20 are block diagrams showing a configuration of a sixth embodiment.
Figure 17:
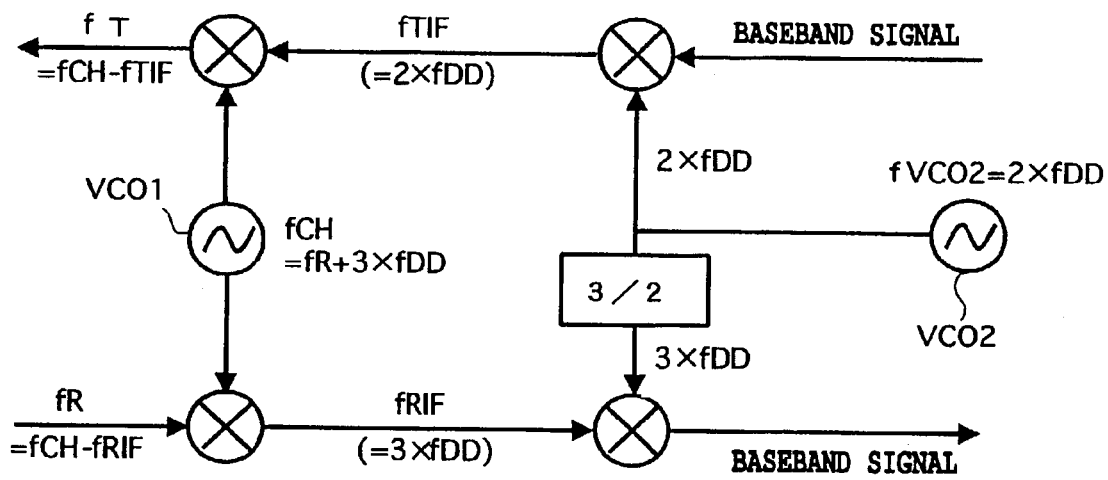
Figure 18:
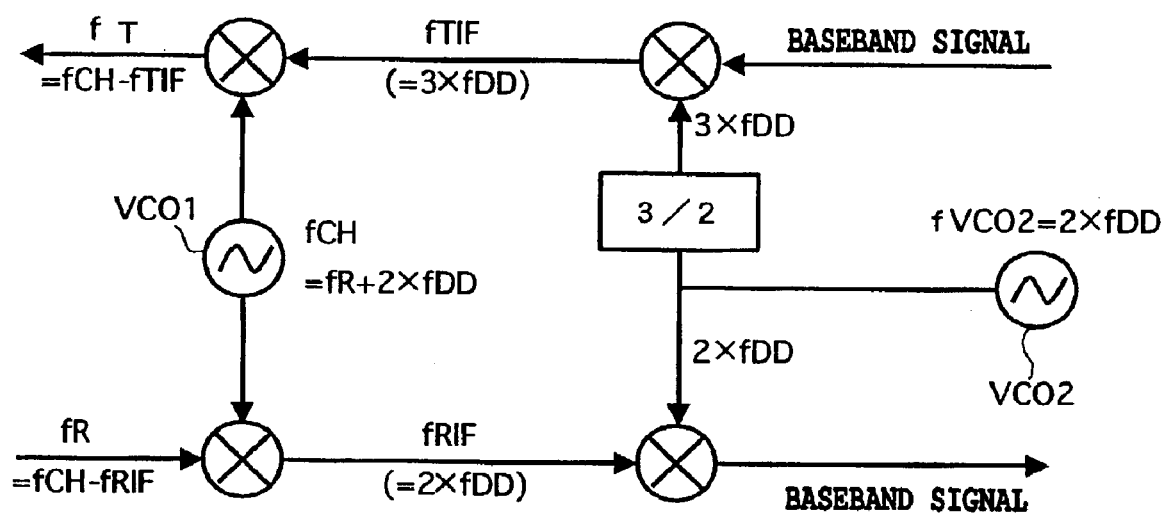
Figure 19:
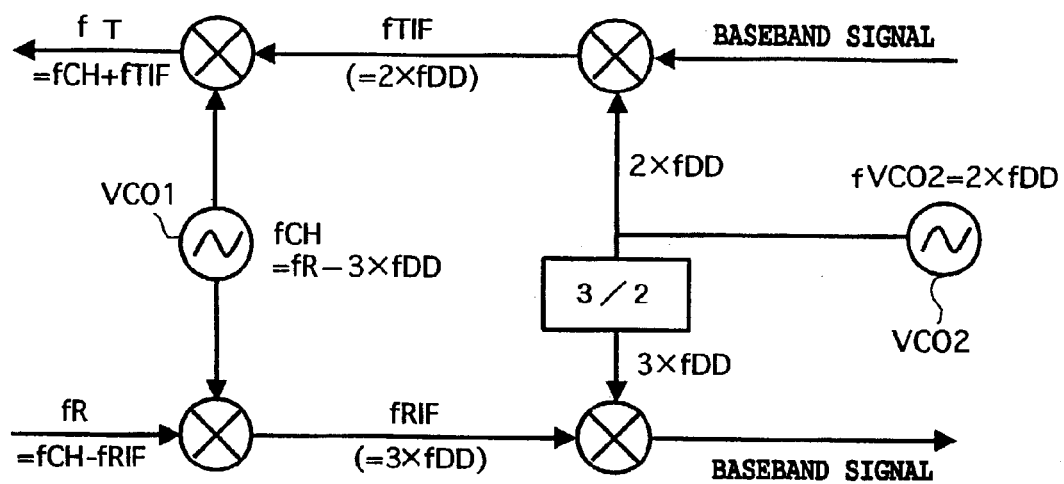

FIGS. 16, 17, 18 and 19 show examples in accordance with the present invention where N=1, which correspond to the foregoing embodiment 2 (FIGS. 9A and 9B), embodiment 3 (FIGS. 10A and 10B), embodiment 4 (FIG. 11) and embodiment 5 (FIG. 12), respectively. More specifically, FIG. 16 shows an example where fT>fR and fT=fCH+FTIF, FIG. 17 shows an example where fT>fR and fT=fCH−fTIF and fR=fCH−fRIF, FIG. 18 shows an example where fT<fR and fT=fCH+FTIF and FIG. 19 shows an example where fT<fR, fT=fCH−fTIF and fR=fCH−fRIF.

The present embodiment differs from the foregoing embodiments 2–5 in that the oscillation frequency of the VCO 2 is 2×fDD, employs a 3/2 frequency multiplier to generate 3×fDD as the fTIF or fRIF, and uses the frequency of the VCO 2 without change on the side of using 2×fDD.

Figure 20:
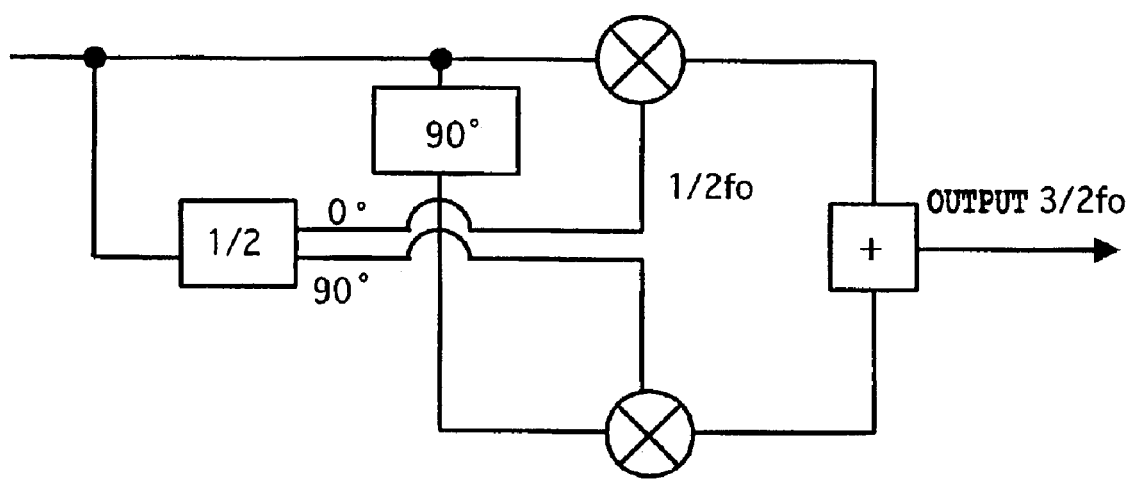

For exactly the same reasons as those of the embodiments 2–5, the frequency difference between the fT and fR becomes fDD, and the communication apparatus without the reception band spurious problem can be implemented. FIG. 20 shows an example of the 3/2 frequency converter in accordance with the present invention. Its configuration is equivalent to that of FIG. 15 minus the final frequency divider of the frequency converter. Thus, the present embodiment can be implemented easily.

Furthermore, when the mixer on the side using the 2×fDD requires the two inputs with the 90 degree phase difference, a phase shifter for generating them may be interposed between the VCO 2 and the mixer, in which case the frequency structure assumes one of the structures as shown in FIGS. 16–19.

Finally, the present invention will be described in which M is generalized as an integer equal to or greater than two.

Embodiment 7

Figure 21A:
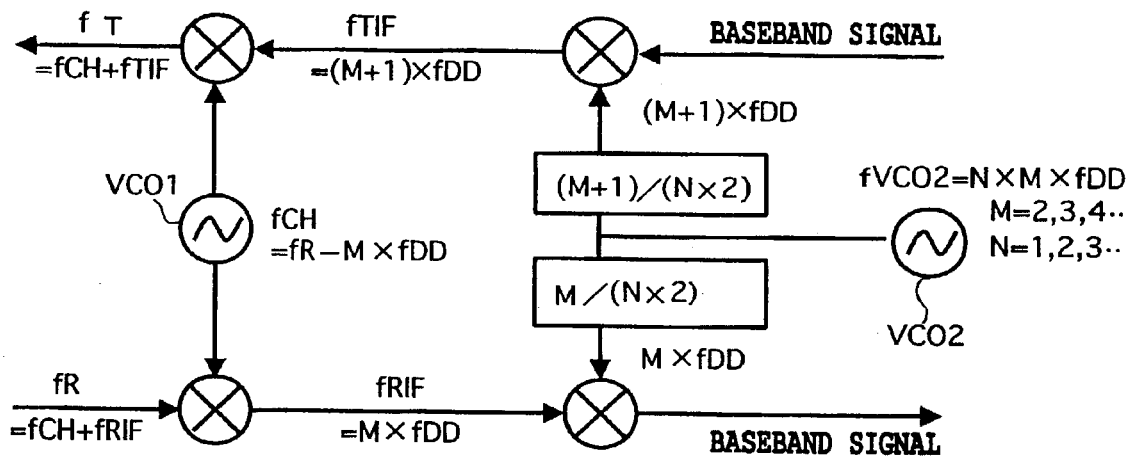
FIGS. 21A, 21B, 22A, 22B, 23A, 23B, 24A, 24B and 25 are block diagrams showing a configuration of a seventh embodiment.
Figure 21B:
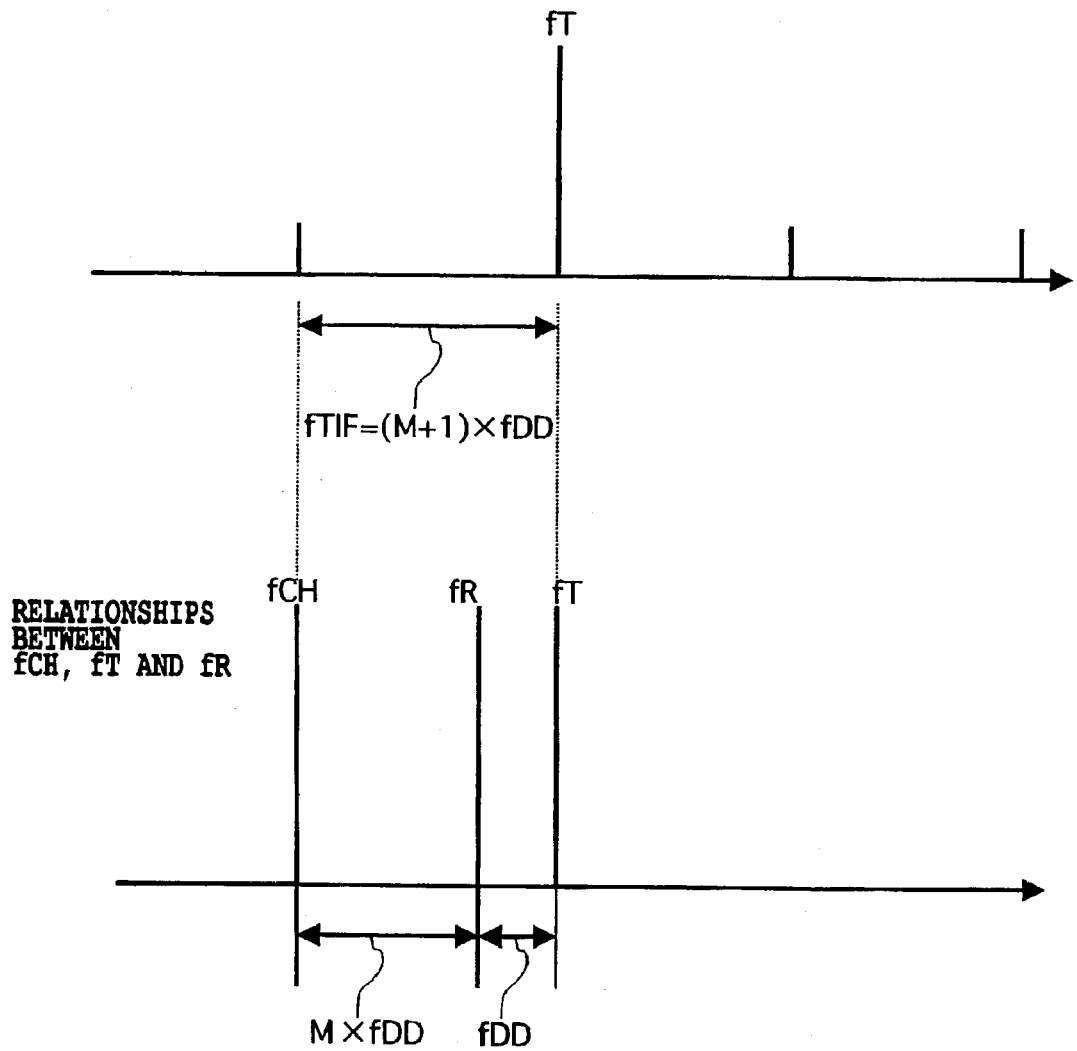
Figure 22A:
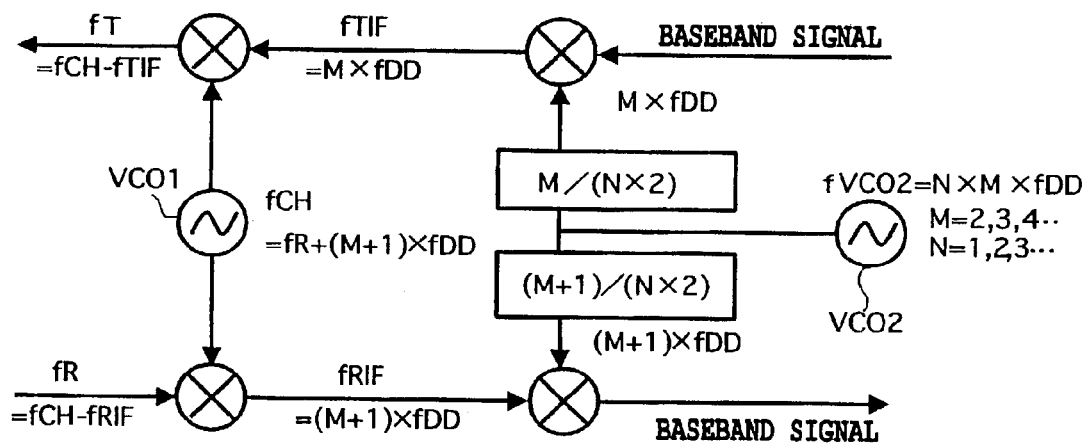
Figure 22B:
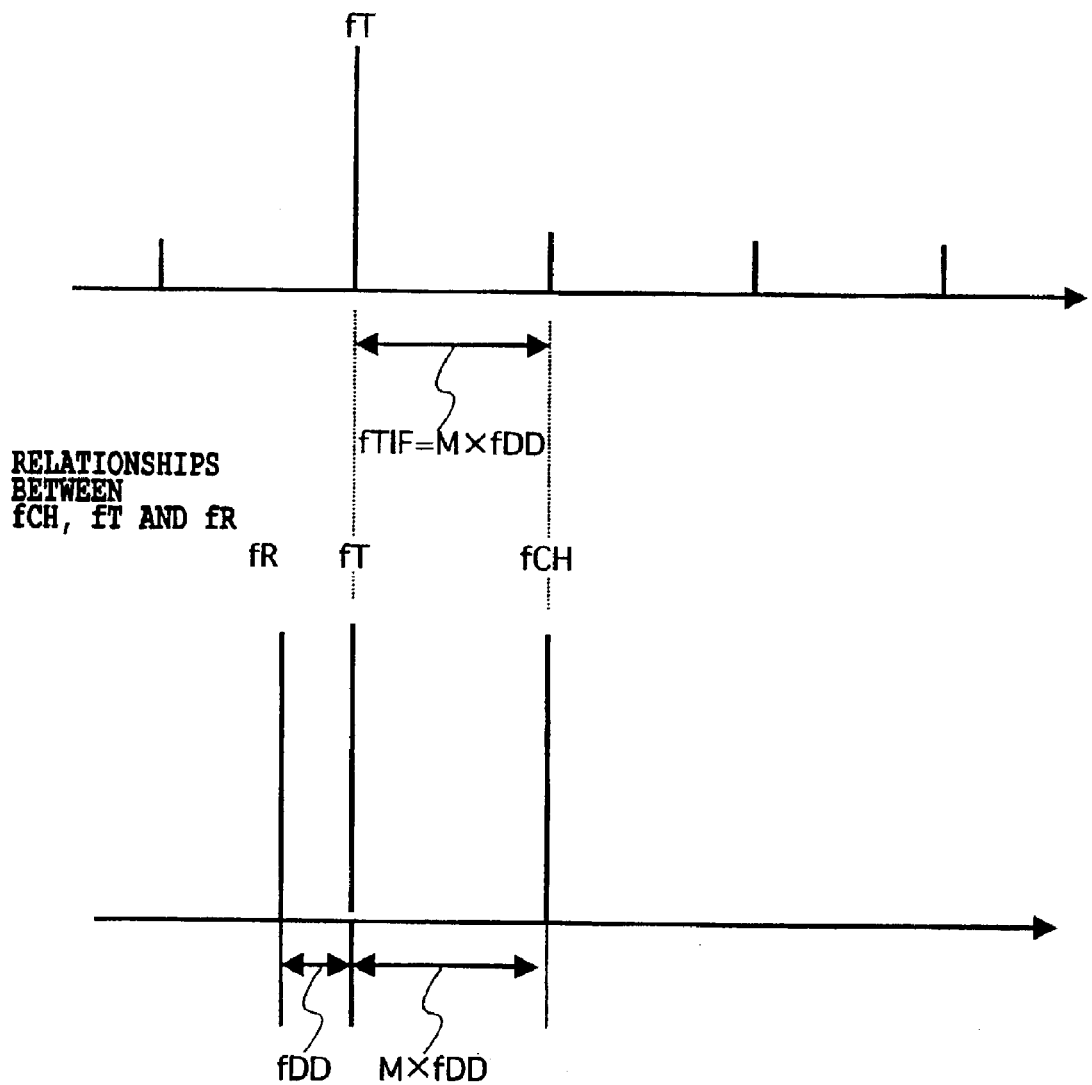
Figure 23A:
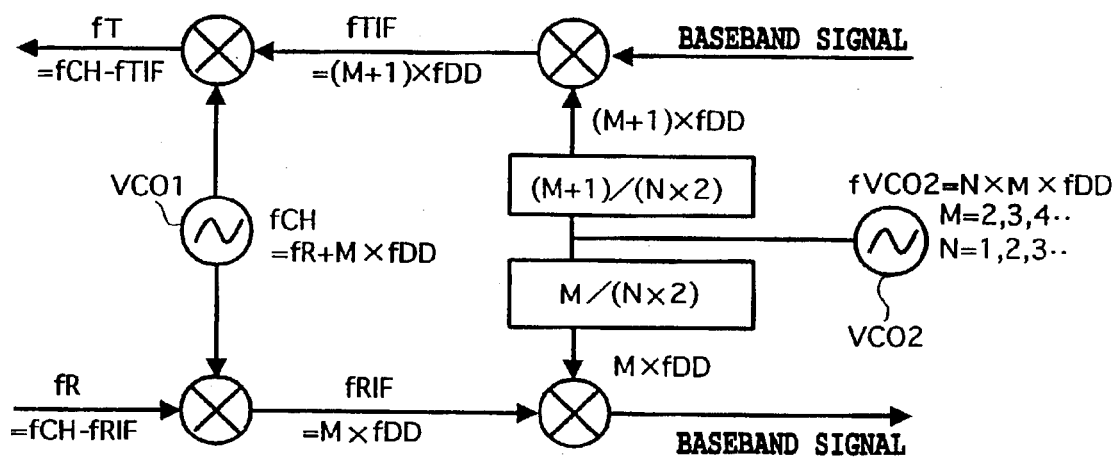
Figure 23B:
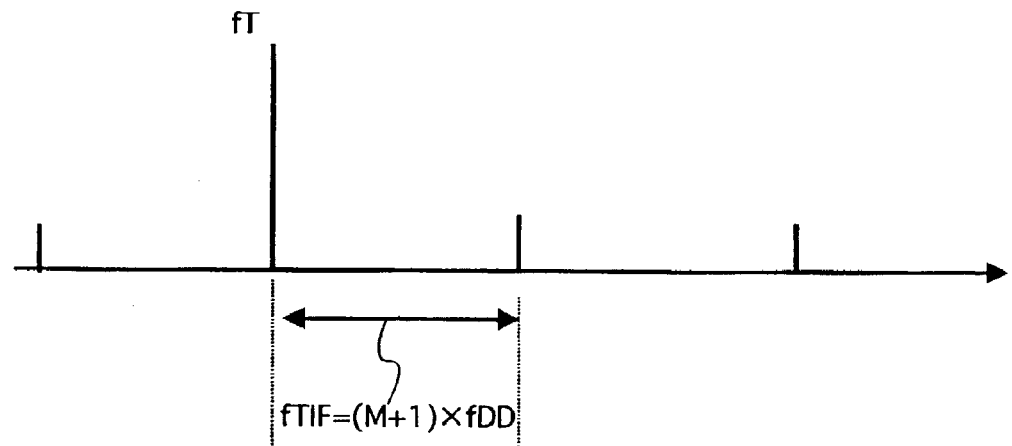
Figure 23B:
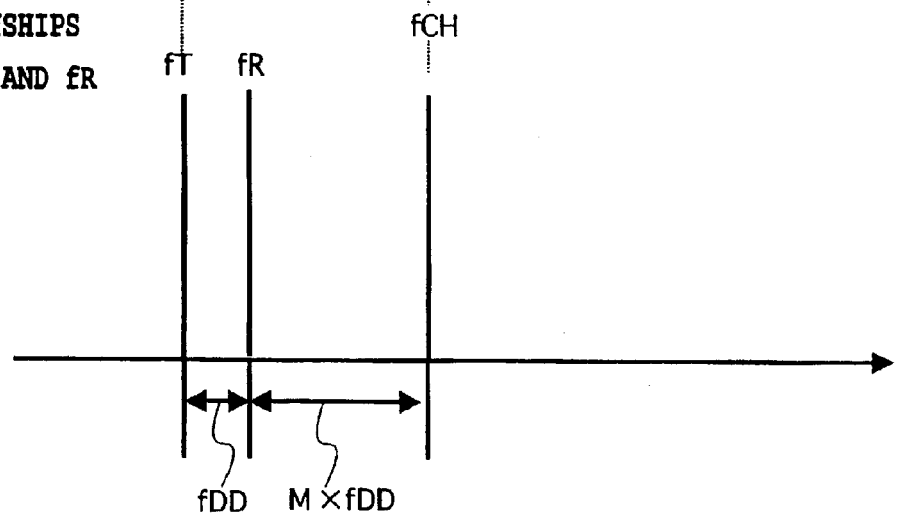
Figure 24A:
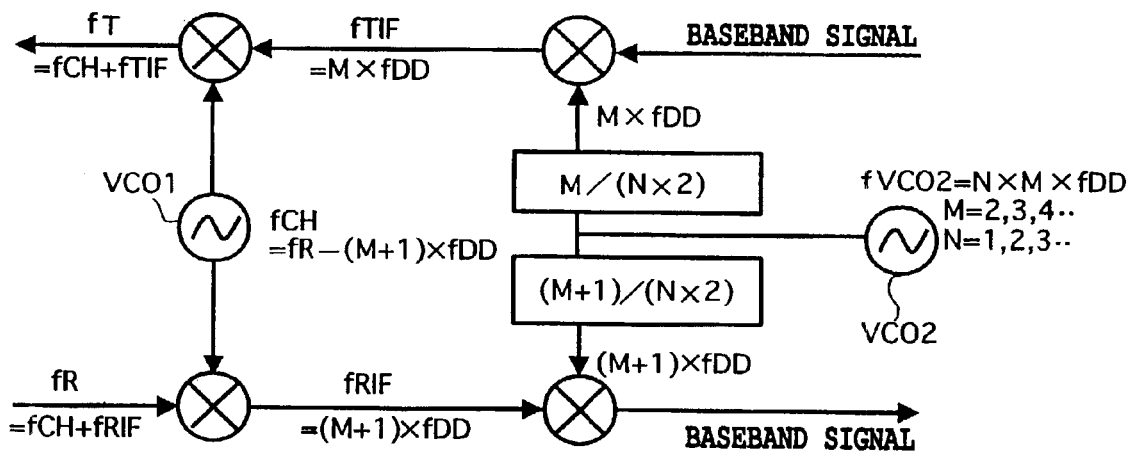
Figure 24B:
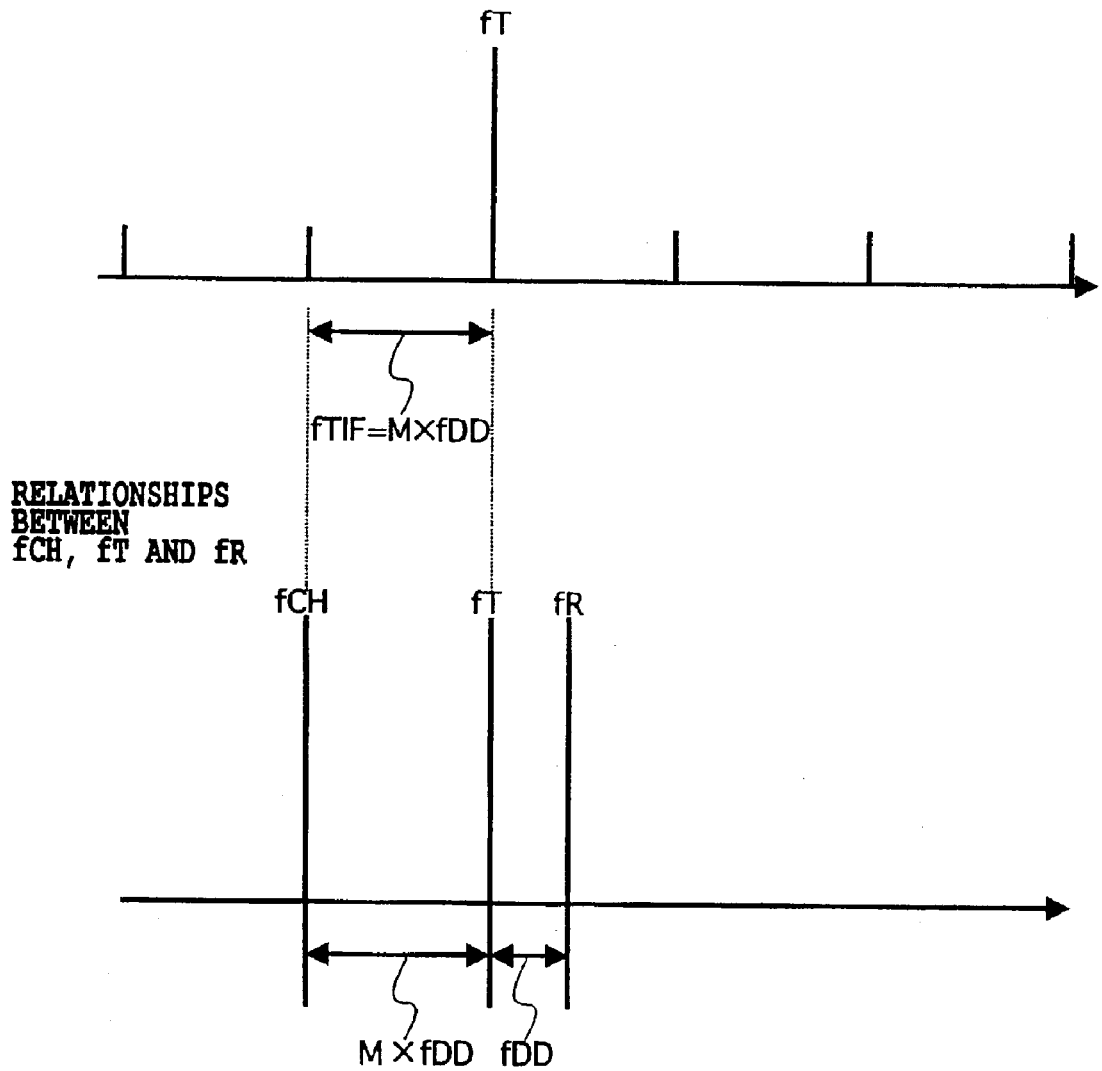

FIGS. 21A, 21B, 22A, 22B, 23A, 23B, 24A and 24B show examples in accordance with the present invention where M is generalized to an integer equal to or greater than two, which examples correspond to the foregoing embodiment 2 (FIGS. 9A and 9B), embodiment 3 (FIGS. 10A and 10B), embodiment 4 (FIG. 11) and embodiment 5 (FIG. 12), respectively. More specifically, FIGS. 21A and 21B show an example where fT>fR and fT=fCH+FTIF, FIGS. 22A and 22B show an example where fT>fR, fT=fCH−fTIF, and fR=fCH−fRIF, FIGS. 23A and 23B show an example where fT<fR and fT=fCH+FTIF, and FIGS. 24A and 24B show an example where fT<fR, fT=fCH−fTIF, and fR=fCH−fRIF.

In these figures, since frequency converters in blocks include the case where N=1, they are generalized to include a case where the frequency conversion value is "1". Thus, although they formally include 1 frequency converter (multiplier), this means that the frequency of the VCO 2 is used without the frequency conversion in the foregoing embodiment 6 as shown in FIGS. 16, 17, 18 and 19.

The present embodiment differs from the foregoing embodiments 2–5 in that the oscillation frequency of the VCO 2 is M×fDD, uses (M+1)×fDD and M×fDD as the fTIF and fRIF (or as the fRIF and fTIF), and employs the (M+1)/(N×2) frequency multiplier to generate the (M+1)×fDD, and the M/(N×2) frequency multiplier to generate the M×fDD.

Accordingly, when M=2 and N is an integer equal to or greater than two, they agree with their counterparts as shown in FIGS. 9A and 9B to FIG. 12.

When M=2 and N=1, they agree with their counterparts as shown in FIGS. 16–19.

The present configurations, which place the frequency difference between the fT and fR at fDD, can implement a communication apparatus without the reception band spurious problem. In other words, as illustrated at the bottom of FIGS. 21B–24B, there is no transmission spurious components overlapping on the reception band in general.

Incidentally, in the present embodiment, the frequency converter on the side of generating the M×fDD can be implemented as a divide-by-K circuit by a known circuit using flip-flops. Since K=(N×M)/2, N is an integer equal to or greater than one, and M is an integer equal to or greater than two, K becomes an integer equal to or greater than one (when K=1, although the frequency converter formally becomes a "divide-by-one frequency converter", this means that the frequency of the VCO 2 is used without the frequency conversion as described above).

In the present embodiment, the frequency converter on the side of generating the (M+1)×fDD is an (M+1)/(N×2) frequency multiplier. When N is an integer multiple of (M+1), that is, J×(M+1), where J is an integer equal to or greater than one, the frequency converter can be implemented easily as 1/(J×2) frequency converter, that is, as a divide-by-H circuit by a known circuit using flip-flops, where H=J×2.

Figure 25:
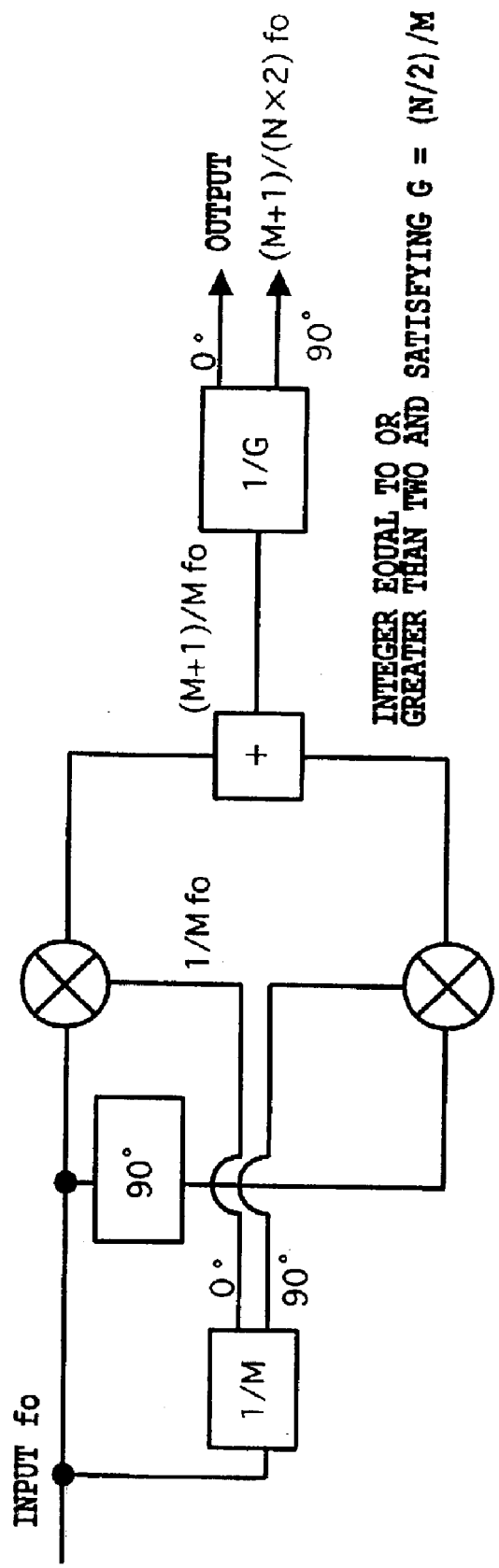

In the present embodiment, the frequency converter on the side of generating the (M+1)×fDD is an (M+1)/(N×2) frequency multiplier. Accordingly, when N is not an integer multiple of (M+1), a frequency converter (multiplier) is required different from a mere frequency divider. Such a frequency conversion can be implemented using a circuit as shown in FIG. 25, which generalizes in terms of N and M the circuit as shown in FIG. 15 where M=N=2. In FIG. 25, the input frequency $f_0$ from the VCO 2 is split to two parts, a first of which is subjected to divide-by-M frequency division, and then mixed with the signal with the frequency $f_0$ by a mixing circuit, thereby undergoing (M+1)/M frequency conversion. Subsequently, it passes through G divide-by-G frequency conversion to complete the (M+1)/(N×2) frequency conversion, where G=(N×2)/M. Accordingly, when using the circuit as shown in FIG. 25, it is necessary for N and M to have such a relationship that makes the G an integer.

The foregoing are only a few of the examples for implementing the present invention. Thus, it is obvious the present invention is not limited to using these circuits, but can use other circuits as long as they bring about the effect of the present invention.

As described above, the present invention is described from the embodiment 6 onward by way of examples where N (integer equal to or greater than one) and M(integer equal to or greater than two) are generalized, in which case the effect of the present invention is implemented in exactly the same manner.

Effect of the Present Invention

As described above, according to the present invention, a communication apparatus can be implemented which employs two oscillators to generate the transmission signal and reception signal, and prevent the harmful spurious component from being generated. In addition, it can simplify the configuration of the frequency converters required.

Although both the transmission and reception employ the indirect scheme in the examples shown in the accompanying drawings of the present specification, this is not essential. As described before in connection with FIG. 1 and FIGS. 2A and 2B, the present invention is applicable to the case where one of the transmission and reception, or both of them employ the direct scheme.

Furthermore, according to the present invention, when the fT and fR (hence fDD) are determined, there are an increasing number of frequency alternatives. For example, there are two combinations for the fRIF and fTIF, and as for the oscillation frequencies of the VCOs, there are two combinations when N=2 as defined in one of the claims, and another two combinations when N=4, etc. Considering practical apparatus configurations, components with frequency dependent characteristics such as IF filters and VCOs are usually affected by the frequency in their performance, sizes, current consumption, and so forth. Therefore having many frequency alternatives is a very important factor to implement optimum apparatus configurations, on which the implementation of the 2-VCO configuration depends.

What is claimed is:

1. A communication apparatus, a transmit frequency fT and a receive frequency fR of which has a difference fDD, said communication apparatus comprising:

a first oscillator for generating a first oscillation signal with an oscillation frequency N×(M×fDD), where N is an integer equal to or greater than one and M is an integer equal to or greater than two;

a frequency converter receiving the first oscillation signal, for converting it to a first signal with an output frequency fTIF, where fTIF=(M+1)×fDD or fTIF=M×fDD, and to a second signal with an output frequency fRIF, where fRIF=M×fDD when fTIF=(M+1)×fDD, and fRIF=(M+1)×fDD when fTIF=M×fDD;

a second oscillator with an oscillation frequency fCH, where fCH=fT±fTIF or fCH=fR±fRIF;

a transmitting mixer for outputting a transmission signal with a frequency fT by receiving a baseband signal to be transmitted, the first signal with the frequency fTIF output from said frequency converter, and a signal with the frequency fCH output from said second oscillator; and a receiving mixer for outputting the baseband signal received by receiving a reception signal with a frequency fR, a signal with the frequency fCH output from said second oscillator, and the second signal with the frequency fRIF output from said frequency converter.

2. The communication apparatus as claimed in claim 1, wherein the integer M is two.

3. The communication apparatus as claimed in claim 1 or 2, wherein the integer N is equal to or greater than two.

4. The communication apparatus as claimed in claim 3, wherein said frequency converter uses when converting to the first signal with the output frequency fTIF: an (M+1)/(N×2) frequency multiplier when converting to fTIF=(M+1)×fDD; and a divide-by-K circuit when converting to the frequency fTIF=M×fDD, where K, which is an integer equal to or greater than two, is given by K=(N×M)/2, and wherein said frequency converter uses when converting to the second signal with the output frequency fRIF: a divide-by-K circuit when converting to the frequency fRIF=M×fDD; and an (M+1)/(N×2) frequency multiplier when converting to the frequency fRIF=(M+1)×fDD.

5. The communication apparatus as claimed in claim 4, wherein the integers N and M are selected such that G=(N×2)/M becomes an integer equal to or greater than two, and wherein said (M+1)/(N×2) frequency multiplier comprises:
 a divide-by-M circuit for dividing the frequency of the input signal to generate an M frequency division wave;
 a mixer receiving the input signal and the M frequency division wave of the input signal, for multiplying the frequency of the input signal by (M+1)/M; and
 a divide-by-G circuit for dividing the output frequency of said mixer by G.

6. The communication apparatus as claimed in claim 5, wherein said mixer carries out single sideband mixing as its mixing operation, and selectively generates a frequency equal to the input frequency multiplied by (M+1)/M.

7. The communication apparatus as claimed in claim 3, wherein the integer N is two or four.

* * * * *